United States Patent [19]
Omoya et al.

[11] Patent Number: 6,139,777
[45] Date of Patent: Oct. 31, 2000

[54] CONDUCTIVE PASTE FOR FILLING VIA-HOLE, DOUBLE-SIDED AND MULTILAYER PRINTED CIRCUIT BOARDS USING THE SAME, AND METHOD FOR PRODUCING THE SAME

[75] Inventors: Kazunori Omoya; Takeshi Suzuki; Tatsuo Ogawa; Takashi Oobayashi, all of Osaka, Japan

[73] Assignee: Matsushita Electric Industrial Co., Ltd., Osaka, Japan

[21] Appl. No.: 09/304,700

[22] Filed: May 4, 1999

[30] Foreign Application Priority Data

May 8, 1998 [JP] Japan ................................. 10-126412

[51] Int. Cl.[7] .............................. H01B 1/22; B05D 5/12; H05K 1/00
[52] U.S. Cl. ........................ 252/500; 252/512; 252/513; 252/514; 427/97; 361/748; 428/901; 156/306.3; 216/13; 430/319
[58] Field of Search ..................................... 252/500, 512, 252/513, 514; 361/748; 428/901; 430/319; 216/13; 156/306.3; 427/97

[56] References Cited

FOREIGN PATENT DOCUMENTS 0 651 602  5/1995  European Pat. Off. .

Primary Examiner—Mark Kopec
Attorney, Agent, or Firm—Merchant & Gould P.C.

[57] ABSTRACT

A paste for via-hole filling is provided, and the paste comprises at least (a) 30–70 volume % of conductive particles whose average diameter ranges from 0.5 to 20 $\mu$m and whose specific surface area ranges from 0.05 to 1.5 $m^2/g$, and (b) 70–30 volume % of resin comprising at least 10 weight % of epoxy resin comprising at least one epoxy group per molecule, in which the total amount of a hydroxyl group, an amino group and a carboxyl group is not more than 5 mol % of the epoxy group, and the epoxy equivalent ranges from 100 to 350 g/eq. The conductive paste for filling via-holes and a printed circuit board comprising thereof can be used to provide an inner-via-hole connection between electrode layers without using a through-hole plating technique. The conductive paste comprises a metallic particle such as copper, an epoxy resin, a hardener and a dispersant if necessary. The paste having low viscosity and low volatility is used to fill holes disposed in a laminated substrate. Then, this substrate is heated and pressurized together with copper foils on both sides to attain a printed circuit board where both sides are electrically connected by inner-via-hole.

37 Claims, 6 Drawing Sheets

(a)

(b)

(a)

(b)

CONDUCTIVE PASTE FOR FILLING VIA-HOLE, DOUBLE-SIDED AND MULTILAYER PRINTED CIRCUIT BOARDS USING THE SAME, AND METHOD FOR PRODUCING THE SAME

FIELD OF THE INVENTION

This invention relates to a conductive paste composition used for filling via-holes, a double-sided printed circuit board and a multilayer printed circuit board using the composition, and a method for producing the same.

BACKGROUND OF THE INVENTION

Recently, following the tendency of electronic devices towards high performance and compact size, a circuit board is required to have a high degree of lamination and high density. As a method for connecting layers within a substrate that can bond integrated circuits (IC) and components at the shortest distance, it is well-known that higher density can be attained through an inner-via-hole connection. In the case of a through hole connection employed for a typical glass epoxy multilayer substrate, the connection is achieved by plating through holes so that it was difficult to connect only the necessary layers. In addition, since the substrate comprises a top layer having an electrode land, this part cannot be used to constitute an electrode land of a surface mounting part. Therefore, due to these restrictions, the mounting density cannot be enhanced easily. In order to solve these problems, methods other than using through-holes are employed, for example, a method of reducing through-holes by disposing holes halfway in a substrate, or a method of improving mounting density by filling conductive paste in through-holes and by further closing up holes disposed in the top layer of a substrate at a plating step. However, due to the complicated producing processes, the above-mentioned methods have cost and quantity production problems.

On the other hand, only the necessary layers can be connected in the inner-via-hole connection, and since there are no through-holes in the top layer of the substrate, the mounting property is also excellent.

When this connecting method is applied to a resin substrate, e.g. to a glass epoxy substrate, a double-sided substrate establishes continuity by filling up through-holes with low-viscosity solvent-type silver paste by means of a printing method, which then is dried and hardened. However, the volume resistivity of this connection is as high as about 10 m Ω·cm, and the reliability in thermal shock resistance such as in the heat cycle is poor. The viscosity of the paste should be lowered to improve workability in filling the conductive paste in through-holes. In order to achieve this purpose, conventional methods employed were to use large particles for reducing the amount of conductive particles, or to add a solvent with a low boiling point or a reactant type diluent.

However, when an additive amount of conductive particles was reduced, the problem occurred that contact points between fillers decreased and the resistivity of a via-hole-connection became so high that reliability could not be maintained in a test where thermal stress occurs, e.g., in the heat cycle test. With use of the method in which a solvent with a low boiling point or a reactant type diluent was added, these components volatilized and decreased enormously in weight while being hardened through heat-pressurizing. Due to these volatile components, the base material either swelled or lost peel strength to the copper foils of the wiring.

In order to overcome these problems, Published Unexamined Japanese Patent Application (Tokkai-Hei) No. 7-176846 discloses a solventless conductive paste with low viscosity, high conductivity and reliability in conductive connection and resistance to thermal shock.

In the conventional conductive paste comprising linoleic dimer acid glycidyl ester type epoxy resin as a main component, the crosslinking density is low. As a result, though the paste was less viscous and resistant to thermal shock, the water absorption was high and the reliability in conductive connection was insufficient in a high humidity test. Moreover, the adhesion strength of the linoleic dimer acid glycidyl ester type epoxy resin is not so high as an epoxy resin. When a conductive paste comprising mainly this resin was used for filling via-holes, adhesion to wiring copper foils was insufficient.

A well-known method to lower the water absorption of epoxy resin and improve the adhesion strength is blending an epoxy resin that has a low epoxy equivalent, such as bisphenol-type epoxy resin, so that the crosslinking density can be increased. Although such a resin with low epoxy equivalent can decrease water absorption and improve adhesion strength, it has higher viscosity than that of linoleic dimer acid glycidyl ester type epoxy resin or the like. As a result, such a conductive paste cannot be used for filling via-holes.

SUMMARY OF THE INVENTION

An object of this invention is to solve the above-noted problems by providing a conductive paste composition having low viscosity and low volatility, and such a paste can achieve an electrical connection, high thermal shock resistance, high humidity resistance and high connection strength between electrode layers connected through inner-via-holes. Another object of this invention is to provide a double-sided printed circuit board, or a multilayer printed circuit board, including inner-via-hole connections using this paste.

The inventors discovered that the viscosity of a conductive paste is determined not only by the resin viscosity, but also the presence of a hydroxyl group, an amino group and a carboxyl group included in the epoxy compound. Based on this discovery, the inventors provide a solventless low-viscosity conductive paste composition having low water absorption and strong adhesion in order to improve workability in via-hole filling, and also double-sided printed circuit boards and multilayer printed circuit boards that have inner-via-hole connection using the paste. The amino groups include primary and secondary amines or the like.

A conductive paste of this invention comprises:

(a) 30–70 volume % of conductive particles whose average diameter ranges from 0.5 to 20 μm and the specific surface area ranges from 0.05 to 1.5 $m^2/g$;

(b) 70–30 volume % of resin comprising at least 10 weight % epoxy compound that has at least one epoxy group per molecule, and in the epoxy compound, the total amount of a hydroxyl group, an amino group and a carboxyl group is not more than 5 mol % of the epoxy group, and an epoxy equivalent of the epoxy compound ranges from 100 to 350 g/eq. It is preferable that the total amount of the hydroxyl group, amino group and carboxyl group is not more than 3 mol % of the epoxy group. Molecular distillation can be used to reduce the total amount of the hydroxyl group, amino group and carboxyl group in the epoxy compound. Here, 'epoxy equivalent' indicates the molecular weight of an epoxy compound per epoxy group.

It is preferable in the conductive paste that the conductive particles are at least one kind of particles selected from the groups I–IV:

(I) at least one kind of particle selected from the group consisting of gold, platinum, silver, palladium, copper, nickel, tin, lead, and indium;

(II) alloy particles of arbitrarily-combined materials selected from the group consisting of gold, platinum, silver, palladium, copper, nickel, tin, lead, indium, zinc and chromium;

(III) particles having cores of conductive/non-conductive particles coated with at least one metal selected from the group consisting of gold, platinum, silver, palladium, copper, nickel, tin, lead, and indium;

(IV) particles having cores of conductive/non-conductive particles coated with alloy of arbitrarily-combined materials selected from the group consisting of gold, platinum, silver, palladium, copper, nickel, tin, lead, indium, zinc and chromium.

It is also preferable that the conductive particles comprise copper whose surface oxygen concentration is 1.0 weight percent or less.

It is preferable that the epoxy compound is at least one epoxy resin selected from the group consisting of glycidyl ether type epoxy resin, glycidyl ester type epoxy resin, glycidyl amine type epoxy resin, and alicyclic epoxy resin.

It is preferable that the epoxy compound is a bisphenol glycidyl ether type epoxy resin.

It is preferable that the epoxy compound comprises an epoxy oligomer whose weight-average molecular weight ranges from 600 to 10000.

It is preferable that the epoxy compound comprises:

(A) 90–20 weight % of bisphenol glycidyl ether type epoxy resin; and (B) 10–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms.

It is preferable that the epoxy compound comprises at least:

(A) 90–19 weight % of bisphenol glycidyl ether type epoxy resin;

(B) 9–80 weight % of long-chain aliphatic alcohol glycidyl ether type epoxy resin having at least eight carbon atoms and/or long-chain fatty acid glycidyl ester type epoxy resin having at least eight carbon atoms; and (C) 1–30 weight % of epoxy oligomer whose weight-average molecular weight ranges from 600 to 10000.

It is preferable that the viscosity of the paste composition is represented by (A/B)=1 or less, where (A) denotes viscosity at 1[1/sec] while (B) denotes viscosity at 2[1/sec], at 25° C.

double-sided printed circuit board of this invention comprises an insulating base material provided with inner-via-holes filled with a conductive resin, and the upper and lower electrode layers on the insulating base are electrically connected to each other, wherein the conductive resin comprises (a) 30–70 volume % of conductive particles having an average diameter from 0.5 to 20 μm and a specific surface area from 0.05 to 1.5 m²/g, and (b) 70–30 volume % of resin containing at least 10 weight % of epoxy compound having at least one epoxy group per molecule, and in the epoxy compound, the total amount of a hydroxyl group, an amino group and a carboxyl group is not more than 5 mol % of the epoxy group, and the epoxy equivalent of the epoxy compound ranges from 100 to 350 g/eq, wherein the conductive resin composition is hardened in the inner-via-holes.

It is preferable in the double-sided printed circuit board that the insulating base comprises a composite material of an aramid fiber and a thermosetting resin.

Furthermore, it is preferable that the insulating base material comprises a composite of an aramid nonwoven fabric in which a thermosetting resin is impregnated.

A multilayer printed circuit board of this invention comprises a plurality of insulating base layers and two or more electrode layers, each insulating base being provided with inner-via-holes filled with a conductive resin, wherein the conductive resin comprises at least 30–70 volume % of conductive particles having an average diameter from 0.5 to 20 μm and a specific surface area from 0.05 to 1.5 m²/g; and 70–30 volume % of resin containing at least 10 weight % of epoxy compound having at least one epoxy group per molecule, and in the epoxy compound the total amount of a hydroxyl group, an amino group and a carboxyl group is not more than 5 mol % of the epoxy group, wherein an epoxy equivalent of the epoxy compound ranges from 100 to 350 g/eq, wherein the resin is hardened in the inner-via-holes, wherein the electrode layers are connected to each other via the inner-via-holes.

It is preferable in the multilayer printed circuit board that the insulating base comprises a composite material of an aramid fiber and a thermosetting resin.

Furthermore, it is preferable that the insulating base material comprises a composite of an aramid nonwoven fabric in which a thermosetting resin is impregnated.

A method for producing a double-sided printed circuit board of this invention comprises the steps of:

providing a prepreg for a printed circuit board with via-holes in advance;

filling the via-holes with a conductive paste comprising (a) 30–70 volume % of conductive particles having an average diameter from 0.5 to 20 μm and a specific surface area from 0.05 to 1.5 m²/g; and (b) 70–30 volume % of resin containing at least 10 weight % of epoxy compound having at least one epoxy group per molecule, wherein in the epoxy compound, the total amount of a hydroxyl group, an amino group and a carboxyl group is not more than 5 mol % of the epoxy group, and an epoxy equivalent of the epoxy compound ranges from 100 to 350 g/eq;

placing copper foils on the upper and lower surfaces of the prepreg, heat-pressurizing the prepreg with the copper foils; and forming an electric circuit by etching the copper foils.

It is preferable in the method for producing a double-sided printed circuit board that the prepreg comprises a composite material of an aramid fiber and a thermosetting resin.

Furthermore, it is preferable that the prepreg is a sheet composed of an aramid nonwoven fabric impregnated with a thermosetting epoxy resin.

It is preferable that the conductive particles are at least one kind of particles selected from the groups I–IV:

(I) at least one kind of particle selected from the group consisting of gold, platinum, silver, palladium, copper, nickel, tin, lead, and indium;

(II) alloy particles of arbitrarily-combined materials selected from the group consisting of gold, platinum, silver, palladium, copper, nickel, tin, lead, indium, zinc and chromium;

(III) particles having cores of conductive/non-conductive particles coated with at least one metal selected from the group consisting of gold, platinum, silver, palladium, copper, nickel, tin, lead, and indium;

(IV) particles having cores of conductive/non-conductive particles coated with alloy of arbitrarily-combined materials selected from the group consisting of gold, platinum, silver, palladium, copper, nickel, tin, lead, indium, zinc and chromium.

It is also preferable that the conductive particles comprise copper whose surface oxygen concentration is 1.0 weight percent or less.

It is preferable that the epoxy compound is at least one epoxy resin selected from the group consisting of glycidyl ether type epoxy resin, glycidyl ester type epoxy resin, glycidyl amine type epoxy resin, and alicyclic epoxy resin.

It is preferable that the epoxy compound is a bisphenol glycidyl ether type epoxy resin.

It is preferable that the epoxy compound comprises:

(A) 90–20 weight % of bisphenol glycidyl ether type epoxy resin; and (B) 10–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms.

It is preferable that the epoxy compound comprises at least:

(A) 90–19 weight % of bisphenol glycidyl ether type epoxy resin;

(B) 9–80 weight % of long-chain aliphatic alcohol glycidyl ether type epoxy resin having at least eight carbon atoms and/or long-chain fatty acid glycidyl ester type epoxy resin having at least eight carbon atoms; and (C) 1–30 weight % of epoxy oligomer whose weight-average molecular weight ranges from 600 to 10000.

It is preferable that the viscosity of the paste composition is represented by (A/B)=1 or less, where (A) denotes viscosity at 1[1/sec] while (B) denotes viscosity at 2[1/sec] at 25° C.

A method for producing a multilayer printed circuit board of this invention comprises the steps of:

providing a prepreg for a printed circuit board with via-holes in advance;

filling the via-holes with a conductive paste comprising (a) 30–70 volume % of conductive particles having an average diameter from 0.5 to 20 μm and a specific surface area from 0.05 to 1.5 m²/g; and (b) 70–30 volume % of resin containing at least 10 weight % of epoxy compound having at least one epoxy group per molecule, wherein in the epoxy compound, the total amount of a hydroxyl group, an amino group and a carboxyl group is not more than 5 mol % of the epoxy group, and an epoxy equivalent of the epoxy compound ranges from 100 to 350 g/eq in order to form a substrate intermediate; and forming a multilayer printed circuit board including the substrate intermediate, by either one of a process selected from Process (A) and Process (B):

Process (A):

disposing the substrate intermediates to vertically sandwich a double-sided printed circuit board and disposing copper foils to vertically sandwich the substrate intermediates;

heat-pressurizing the substrate intermediates and the double-sided printed circuit board with the copper foils; and forming electric circuits by etching the copper foils;

Process (B):

disposing double-sided printed circuit boards to vertically sandwich the substrate intermediate; and heat-pressurizing the substrate intermediate with the double-sided printed circuit boards.

It is preferable in the method for producing a multilayer printed circuit board that the prepreg comprises a composite material of an aramid fiber and a thermosetting resin.

Furthermore, it is preferable that the prepreg is a sheet composed of an aramid nonwoven fabric impregnated with a thermosetting epoxy resin.

It is preferable that the conductive particles are at least one kind of particles selected from the following groups:

(I) at least one kind of particle selected from the group consisting of gold, platinum, silver, palladium, copper, nickel, tin, lead, and indium;

(II) alloy particles of arbitrarily-combined materials selected from the group consisting of gold, platinum, silver, palladium, copper, nickel, tin, lead, indium, zinc and chromium;

(III) particles having cores of conductive/non-conductive particles coated with at least one metal selected from the group consisting of gold, platinum, silver, palladium, copper, nickel, tin, lead, and indium;

(IV) particles having cores of conductive/non-conductive particles coated with alloy of arbitrarily-combined materials selected from the group consisting of gold, platinum, silver, palladium, copper, nickel, tin, lead, indium, zinc and chromium.

It is also preferable that the conductive particles comprise copper whose surface oxygen concentration is 1.0 weight percent or less.

It is preferable that the epoxy compound is at least one epoxy resin selected from the group consisting of glycidyl ether type epoxy resin, glycidyl ester type epoxy resin, glycidyl amine type epoxy resin, and alicyclic epoxy resin.

It is preferable that the epoxy compound is a bisphenol glycidyl ether type epoxy resin.

It is preferable that the epoxy compound comprises an epoxy oligomer whose weight-average molecular weight ranges from 600 to 10000.

It is preferable that the epoxy compound comprises:

(A) 90–20 weight % of bisphenol glycidyl ether type epoxy resin; and (B) 10–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms.

It is preferable that the epoxy compound comprises at least:

(A) 90–19 weight % of bisphenol glycidyl ether type epoxy resin;

(B) 9–80 weight % of long-chain aliphatic alcohol glycidyl ether type epoxy resin having at least eight carbon atoms and/or long-chain fatty acid glycidyl ester type epoxy resin; and (C) 1–30 weight % of epoxy oligomer whose weight-average molecular weight ranges from 600 to 10000.

It is preferable that the viscosity of the paste composition is represented by (A/B)=1 or less, where (A) denotes viscosity at 1[1/sec] while (B) denotes viscosity at 2[1/sec] at 25° C.

DETAILED DESCRIPTION OF THE PREFERRED EMBODIMENT

This invention will be described by referring to the following illustrative examples and attached figures. In particular, the following embodiments refer to a double-sided printed circuit board with use of a conductive paste for via-hole filling, a method for producing the same, and a multilayer printed circuit board making use thereof.

Figure 1:
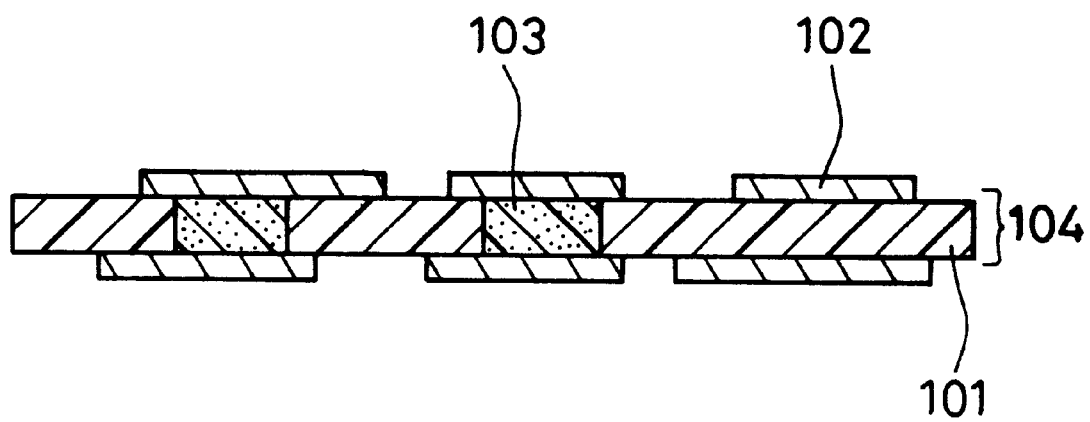
FIG. 1 is a cross-sectional view showing a double-sided printed circuit board of an embodiment of this invention.

FIG. 1 is a cross-sectional view showing a structure of a double-sided printed circuit board of an embodiment of this invention. A double-sided printed circuit board 104 comprises a laminated base material 101, a copper foil 102 (in FIG. 1, a copper foil is formed into a circuit pattern), and a conductive via-hole 103 in which a conductive paste has hardened. One of the major advantages of this invention is that a conductive paste easily can fill due to its low viscosity. The connection filled with the large amount of conductive particles can lower the resistivity and coefficient of thermal expansion. Moreover, as the resin in the conductive paste has low water absorption, high adhesion strength, no solvents and low volatility, the obtained inner-via-hole substrate will have high connection reliability at various environmental tests. The inner via-hole connection means connecting the respective layers of a double-sided printed circuit board and a multilayer printed circuit board at arbitrary positions.

High levels of conductive particles should be included in the conductive paste to form the conductive via-hole 103, since the connection reliability should be maintained even if the substrate is distorted due to the lowering resistivity of the connection via-holes caused by the increased contact rate of the conductive particles, or due to thermal or mechanical stress. In order to disperse the conductive particles with a high concentration, the average diameter of the conductive particles ranges from 0.2 to 20 μm, and the specific surface area is preferably small, or from 0.05 to 1.5 m$^2$/g. If the average diameter is less than 0.2 μm, the specific surface area will exceed 1.5 m$^2$/g, and thus, dispersion with high concentration becomes impossible. When the average particle diameter exceeds 20 μm, the number of conductive particles in the conductive paste filled in a via-hole will be excessively decreased and the connection reliability will be lowered. When the specific surface area is less than 0.05 m$^2$/g, the average particle diameter cannot be controlled to be no greater than 20 μm. When the specific surface area exceeds 1.5 m$^2$/g, the conductive particles cannot be dispersed with a high concentration.

For the conductive paste, low viscosity and low TI (Thixotropy Index) value are preferred to improve the workability in filling via-holes. A proper TI value is 1.0 or less. The TI value indicates the relativization of viscosity at every shear rate when the viscosity of the paste varies depending on the shear rate. In this specification, the TI value specifically means (A/B) when (A) denotes viscosity at 25° C., 1[1/sec] while (B) denotes viscosity at 25° C., 2[1/sec]. The viscosity is measured at a condition of 25° C., R=14 mm, 3° cone, 0.5 rpm (corresponding to 1(1/s) shear rate), by using an E model viscometer (DVU-E model) supplied by TOKI SANGYO Co., Ltd.

Figure 5:
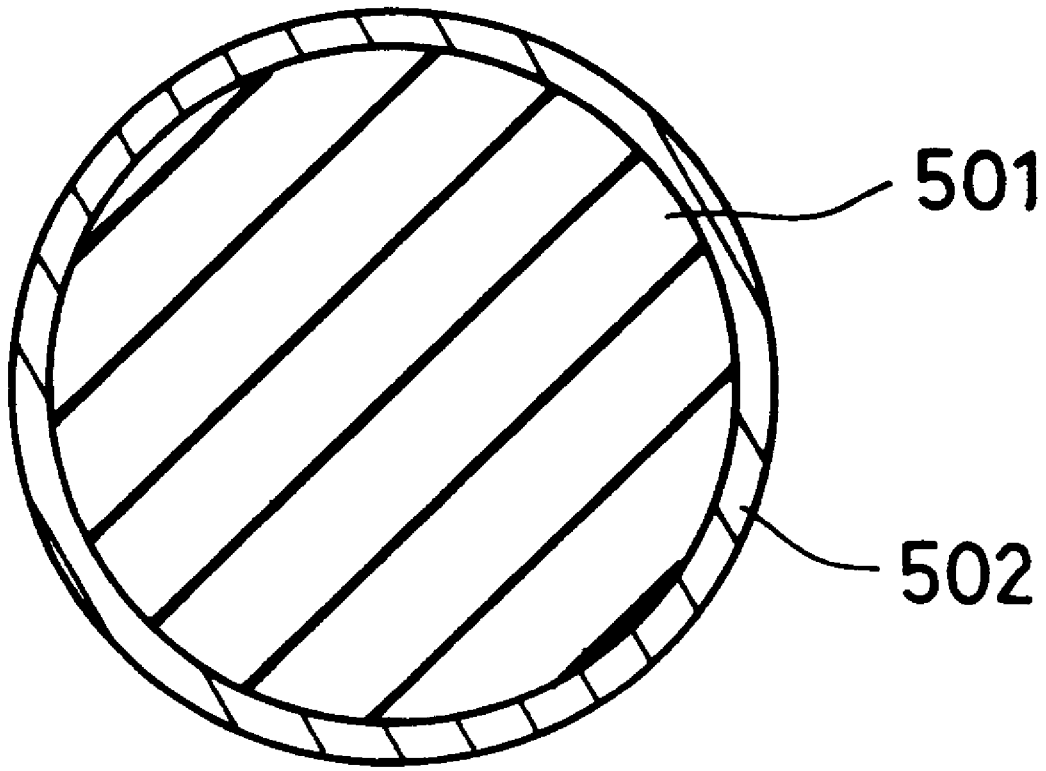
FIG. 5 is a schematic view of a conductive particle used for a printed circuit board of an embodiment of this invention.

As for the conductive particles, almost any kind of noble metal such as gold, platinum, silver and palladium, or base metals such as copper, nickel, tin, lead and indium can be used. In addition, not only pure metals can be used, but also alloyed metals or those comprising a metal or an insulating core covered with a conductive material as shown in FIG. 5. In FIG. 5, 501 denotes a spherical core, and 502 denotes a conductive material that covers the core surface and serves as the conductive filler. The conductive particles have no special limitation if they are included in the range for the average particle diameter and specific surface area.

Copper powder is preferably used for the conductive particles for migration control and for an economic supply at a stable cost. In general, however, copper powder is easily oxidized, and this will deteriorate conductivity. Therefore, a preferable oxygen concentration of the copper powder is 1.0 weight % or less if the copper powder is used for filling via-holes.

The resin included in the conductive paste to form the conductive via-hole 103 should meet the following requirements to form a conductive composition for inner-via-holes with high connection reliability. In other words, the resin is required generally to be solventless and less viscous while it has low water absorption and high adhesion strength. A resin to meet such requirements comprises at least 10 weight % of epoxy compound having at least one epoxy group in one molecule, wherein a hydroxyl group, an amino group and a carboxyl group are also included in a proportion not to exceed 5 mol % of the epoxy resin, and the epoxy equivalent ranges from 100 to 350 g/eq. The epoxy compound must be included to improve the adhesion strength. The hydroxyl group, amino group and carboxyl group should be controlled not to exceed 5 mol % of the epoxy resin, since these functional groups with high hydrogen bonding strength will raise the viscosity of the conductive paste even if the viscosity of the resin is low. When the proportion of these functional groups with high hydrogen bonding strength is 5 mol % or less, a conductive paste with a low viscosity can be obtained even if the resin has a high viscosity. Though the ratio of the hydroxyl group, amino group and carboxyl group to the epoxy group can be examined by a chemical quantitative analysis, and infrared spectroscopic analysis also can be used in a simple manner. The absorbance around 3500 cm$^{-1}$ indicates a hydroxyl group, an amino group and a carboxyl group, while absorbance around 910 cm$^{-1}$ indicates epoxy groups. When the epoxy equivalent exceeds 350 g/eq, the crosslinking density is excessively low, and thus, the water absorption becomes high while the adhesion strength is decreased. When the epoxy equivalent is less than 100 g/eq, the crosslinking density is excessively high, and thus, the hardening-shrinkage distortion becomes great and the adhesion strength is decreased. A conductive paste with low viscosity, low water absorption and high adhesion strength can be obtained if the proportion of the epoxy resin included in the resin is 10 weight % or more. Resin components other than the epoxy compound are not specifically limited as long as they are solventless. An epoxy hardener will be included to be reacted with the epoxy compound for hardening as required. Preferably the conductive paste viscosity is 2000 Pa·s or less, and the TI value is 1 or less. When the viscosity or TI value deviates from the range, the via-holes cannot be filled. If any solvents are included in the resin of this invention, the volatile components will vaporize to cause voids in the structure with the filled via-holes or the prepreg is peeled off when the conductive composition is filled in the via-holes to be heat-pressurized, and thus, the connection becomes unstable.

Preferable epoxy compounds include glycidyl ether type epoxy resin, glycidyl ester type epoxy resin, glycidyl amine type epoxy resin, and alicyclic epoxy resin. The following bisphenol glycidyl ether type epoxy resins are specifically preferred to realize low viscosity, low water absorption and high adhesion strength: bisphenol A type epoxy resin (Formula 1), bisphenol F type epoxy resin (Formula 2), bisphenol AD type epoxy resin (Formula 3), hydrogenated bisphenol type epoxy resin (Formula 4), alkylene oxide denatured bisphenol type epoxy resin (Formula 5), and alkoxy denatured bisphenol type epoxy resin (Formula 6). These bisphenol glycidyl ether type epoxy resins can be used alone or used as an arbitrary combination thereof.

Formula 1

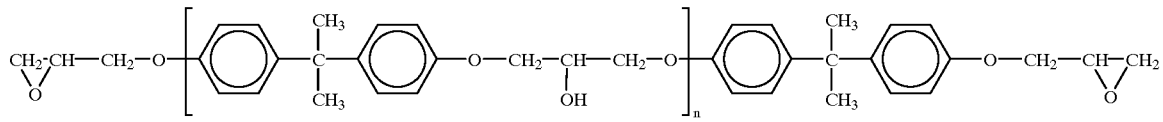

(Here, n ≥ 0.)

Formula 2

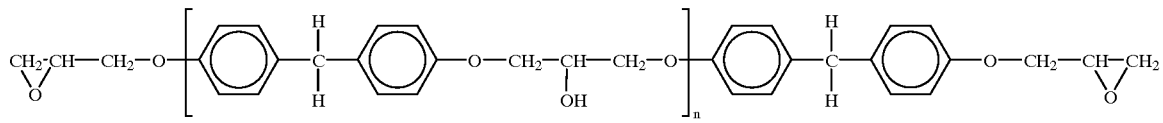

(Here, n ≥ 0.)

Formula 3

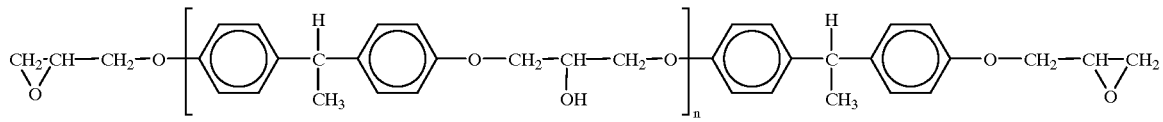

(Here, n ≥ 0.)

Formula 4

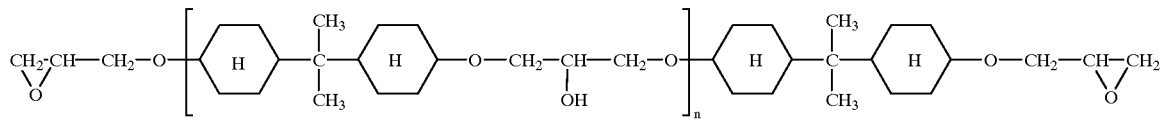

(Here, n ≥ 0.)

Formula 5

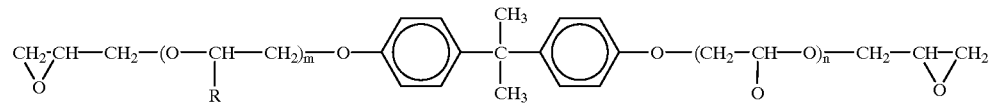

Here, $R = C_pH_{2p+1}$ (p≥0), m+n ≥ 2.)

Formula 6

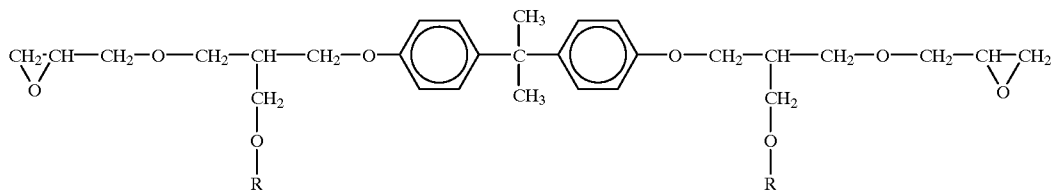

Here, $R = C_pH_{2p+1}$ $(p \geq 1)$.

A resin comprising an epoxy compound containing (A) 90–20 weight % bisphenol glycidyl ether type epoxy resin and (B) 10–80 weight % long-chain aliphatic alcohol glycidyl ether type epoxy resin having at least eight carbon atoms in the alcohol group or a long-chain fatty acid glycidyl ester type epoxy resin having at least eight carbon atoms in the fatty acid group is specifically preferable, since it has low viscosity, low water absorption rate and high adhesion strength. Moreover, the resin can buffer stress effectively, and thus, connection reliability of the via-holes is improved. The (A) group includes bisphenol A type epoxy resin (Formula 1), bisphenol F type epoxy resin (Formula 2), bisphenol AD type epoxy resin (Formula 3), hydrogenated bisphenol type epoxy resin (Formula 4), alkylene oxide denatured bisphenol type epoxy resin (Formula 5), and alkoxy denatured bisphenol type epoxy resin (Formula 6). The (B) group includes linoleic dimer acid glycidyl ester type epoxy resin (Formula 7), isoprene caproic acid dimer glycidyl ester type epoxy resin (Formula 8), versatic acid glycidyl ester type epoxy resin (Formula 9), and lauryl glycidyl ether type epoxy resin (Formula 10). These resins of the groups (A) and (B) can be used efficiently alone or combined arbitrarily.

Formula 7

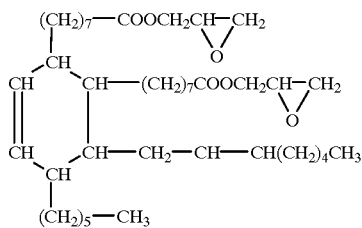

($R^1$, and $R^3$ are alkyl groups and they have eight carbon atoms in total.)

Formula 10

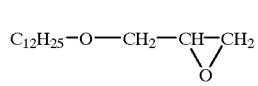

An epoxy oligomer with average molecular weight of 600–10000 can be used appropriately for the epoxy compound. Such an oligomer comprises much less amount of a hydroxyl group, an amino group and a carboxyl group when compared to the epoxy group, and the shear rate dependency (TI value) of the viscosity is decreased as the resin molecular weight of the conductive paste is increased. As a result, the conductive paste has low viscosity. Moreover, the epoxy oligomer can improve the peeling-adhesion strength.

A resin comprising an epoxy compound containing (A) 90–20 weight % bisphenol glycidyl ether type epoxy resin, (B) 10–80 weight % long-chain aliphatic alcohol glycidyl ether type epoxy resin with at least eight carbon atoms in the alcohol group or a long-chain fatty acid glycidyl ester type epoxy resin with at least eight carbon atoms in the fatty acid group, and (C) 1–30 weight % epoxy oligomer whose average molecular weight ranges from 600 to 10000 is specifically preferable, since it has low viscosity, low absorption rate and high adhesion strength. Also, it can buffer stress effectively, and thus, connection reliability of the via-holes is improved. The group (A) includes bisphenol A type epoxy resin (Formula 1), bisphenol F type epoxy resin (Formula 2), bisphenol AD type epoxy resin (Formula 3), hydrogenated bisphenol type epoxy resin (Formula 4), alkylene oxide denatured bisphenol type epoxy resin (Formula 5), and alkoxy denatured bisphenol type epoxy resin (Formula 6). The group (B) includes linoleic dimer acid glycidyl ester type epoxy resin (Formula 7), isoprene Formula 8

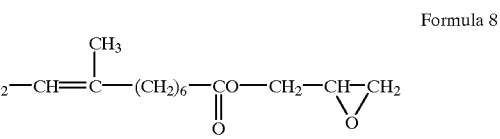

Formula 9

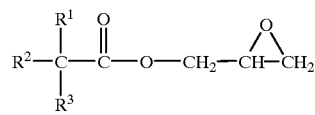

caproic acid dimer glycidyl ester type epoxy resin (Formula 8), versatic acid glycidyl ester type epoxy resin (Formula 9), and lauryl glycidyl ether type epoxy resin (Formula 10). Epoxidated unsaturated fatty acid metamorphic materials (Formula 11), epoxidated polybutadiene (Formula 12), and epoxy polystyrene butadiene copolymer (Formula 13) or the like also can be used for the (B) group. These resins included in the groups (A), (B) and (C) can be used efficiently alone or combined arbitrarily.

Formula 11

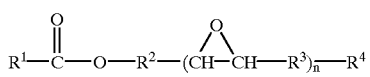

Formula 12

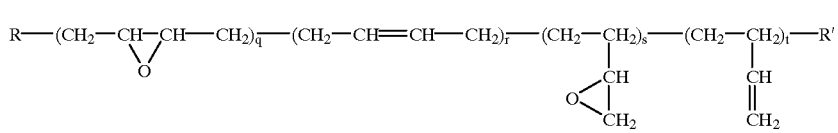

Formula 13

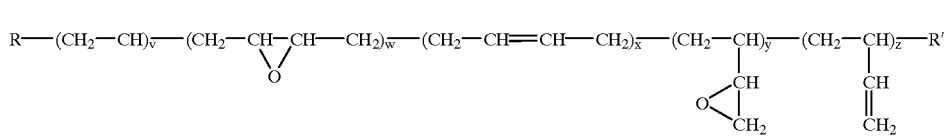

The conductive paste can include resins other than the epoxy resin as required. Appropriate resins include imide resin and phenol resin to improve heat resistance; vinyl polymers such as polyolefin, acrylic resin, polyether, polyester, polyamide and polyurethane to improve strength in peeling and adhering to copper foils. These resins can be used efficiently alone or combined arbitrarily.

Such a conductive paste can include an epoxy hardener as required. Any epoxy hardeners that are commonly used as liquid compositions can be used. The examples are: amine adduct hardeners such as dicyandiamide and carboxylic acid hydrazide; imidazole hardeners such as heptadecyl imidazole; urea hardeners such as 3-(3,4-dichlorophenyl)-1,1-dimethyl urea; acid anhydride hardeners such as phthalic acid anhydride, and methynadic anhydride; phosphine hardeners such as triphenyl phosphine; and Lewis acids such as hexafluoroantimonate. Subclinical hardeners are specifically preferred from the viewpoint of stability of compositions and workability. The subclinical hardener stops its reaction and can be preserved at room temperature for a long time without changing the characteristics. Then, the particles start to melt, decompose or dissolve when heated at a temperature higher than predetermined, and the deactivated reactive radicals appear and start to react all at once, thereby hardening quickly.

The conductive paste can include a dispersant as required. As for dispersants, any ordinary dispersants can be used. First, generally used dispersants include nonionic dispersants such as ethylene oxide of higher fatty acid, propylene oxide addition ester compound, sorbitan fatty acid ester compound, ethylene oxide of polyhydric alcohol such as sorbitan, propylene oxide addition ether compound, ethylene oxide of alkylbenzene, and propylene oxide additive. Secondly, anionic dispersants, e.g., alkylbenzene sulfonic acid alkali salt, higher alcohol sulfuric ester alkali salt, phosphate compound, higher fatty acid, ethylene oxide of higher fatty acid, and sulfate alkali salt with propylene oxide additive can be used. Thirdly, a quaternary ammonium salt type cationic dispersant can be used. In this instance, the dispersant is effective in reducing the viscosity of the paste and lowering the TI value through increasing affinity between the metallic particle surface and an organic resin blended as a binder in the paste.

As laminated base material 101, it is possible to use laminated base materials that are widely known at present. Examples are a glass-epoxy base material, an aramid-epoxy base material, and a paper phenol base material. The base material is called "prepreg" before being heated and pressurized and comprises a glass cloth or a nonwoven fabric as a core material, which is impregnated with an uncured resin.

Figure 2:
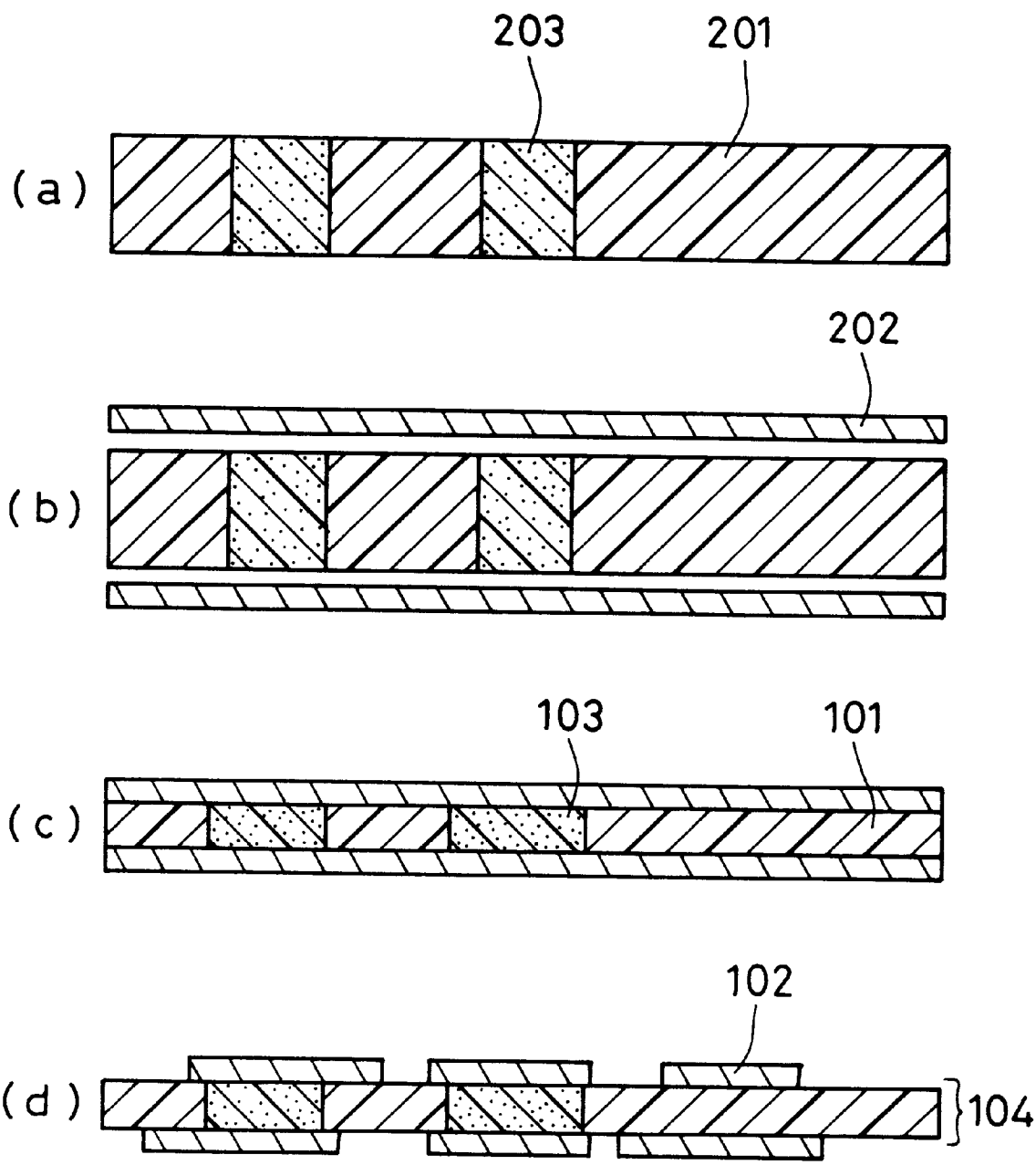
FIGS. 2 (a)–2(d) are cross-sectional views showing a method for forming a double-sided printed circuit board of an embodiment of this invention.

FIG. 2(a) to (d) are views showing a method for forming a double-sided printed circuit board of this invention. In FIG. 2, a laminated base material 201 is a prepreg. This prepreg is provided with through holes. Usually, a drill is used for this step, but a laser beam or the like can be used for processing specific materials. FIG. 2(b) shows a state in which FIG. 2(a) is positioned between a copper foils 202. FIG. 2(c) shows a state after FIG. 2(b) is heated and pressurized. FIG. 2(c) shows a state in which the through holes disposed in the prepreg have an increased amount of metal filling after being heated and pressurized. Due to compression, the prepreg has become thinner and the resin has hardened. The conductive paste 203 remains compressed. Conductor 103 of this state serves for an electrical connection between the upper and lower sides. FIG. 2(d) shows a state after copper foils 202 on the surface are processed (e.g., etched) into circuit patterns. Copper foil 102 becomes a circuit conductor after being processed. After that, printed circuit boards which are actually used must be processed further, for example, applied with a solder resist, printed with letters and signs, or provided with holes for insert components, though explanation is omitted here.

Figure 3:
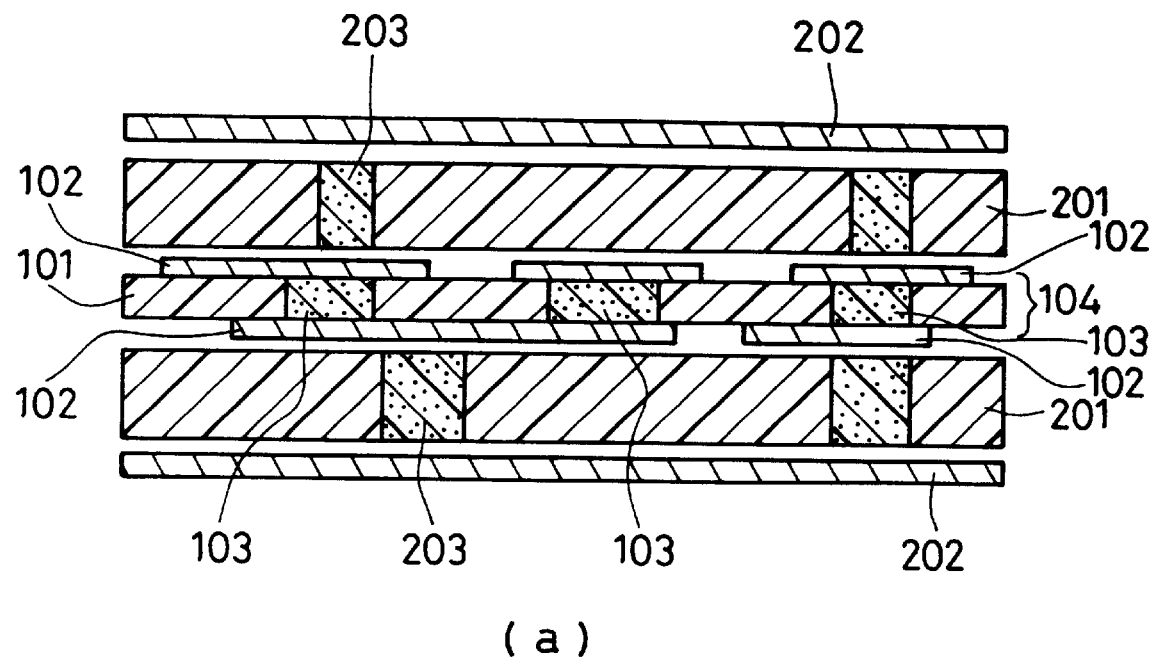
FIGS. 3(a) and 3(b) are cross-sectional views showing a method for forming a multilayer printed circuit board of an embodiment of this invention.
Figure 3:
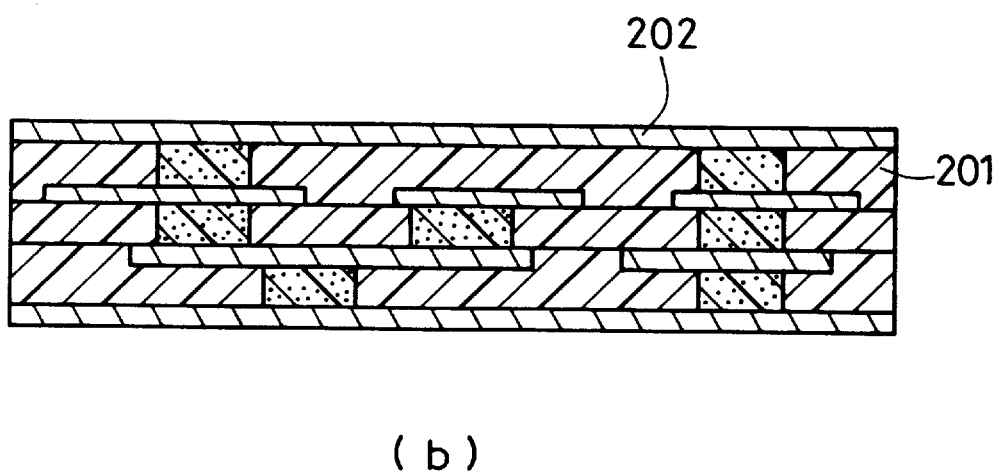

FIGS. 3(a) and (b) show a method for forming a multilayer printed circuit board by repeatedly applying the above-mentioned method for forming a double-sided printed circuit board. FIG. 3(a) shows a state in which a double-sided circuit board 104 serving as a core is positioned between substrates of FIG. 2(a) having through holes filled with conductive paste to which are further applied copper foils 202. When heated and pressurized from the upper and lower sides in this state, a multilayer printed circuit board of FIG. 3(b) is obtained, which already has established an inner-via-hole connection. When the copper foils on the upper and lower sides are patterned, a multilayer printed circuit board consisting of four layers is completed. After that, by repeating these steps, a multilayer printed circuit board with even more layers can be attained.

In the method of manufacturing the multilayer printed circuit board of FIGS. 3(a) and 3(b), the double-sided printed circuit board used for the core was that of this invention. However, this is not necessarily the case here. Instead, it is clear that a conventional through-hole double-sided printed circuit board can be used as well. In this case, it is better to fill the through holes in advance. Here, the through-hole substrate indicates a resin substrate, and not only can the through-hole substrate be used but also a ceramic substrate or the like.

Figure 4:
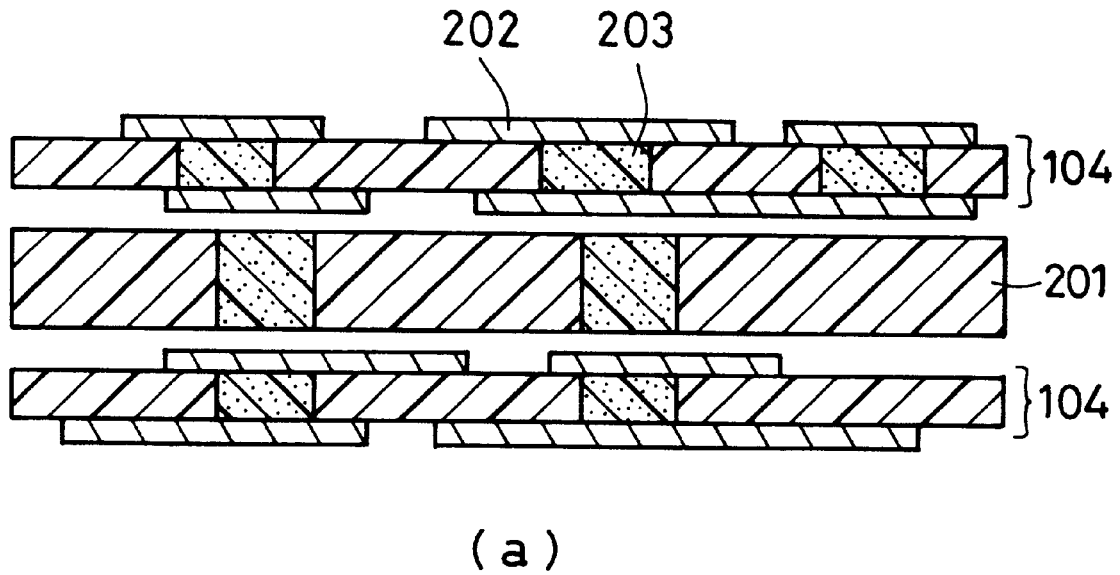
FIGS. 4(a) and 4(b) are cross-sectional views showing another method for forming a multilayer printed circuit board of an embodiment of this invention.
Figure 4:
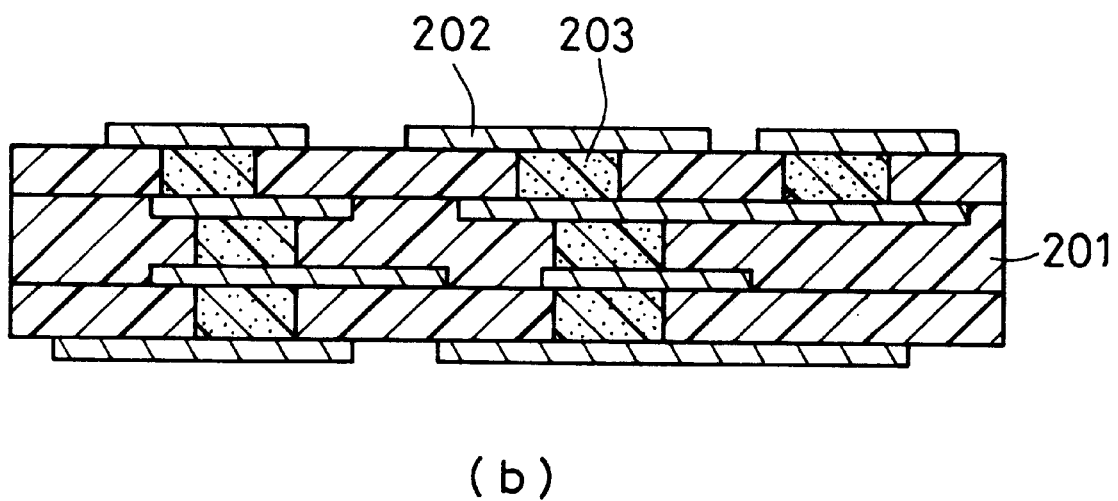

FIGS. 4(a) and (b) show another method for forming a multilayer printed circuit board. In FIG. 4(a), a prepreg 201 which is filled with conductive paste 203 and is in the state before being heated and pressurized is positioned between two sheets of double-sided printed circuit boards 104. When heated and pressurized in this state, a multilayer printed circuit board consisting of four layers of FIG. 4(b) can be obtained. Not only a four-layer circuit board, but a multi-layer printed circuit board consisting of more layers can be obtained by providing a plurality of double-sided printed circuit boards, positioning the above-noted laminated substrates, which are filled with a conductive filler and are in a state before being heated and pressurized between the double-sided printed circuit boards, and heating and pressurizing.

In the method for forming the multilayer printed circuit board of FIGS. 4(a) and 4(b), the double-sided printed circuit board used was that of this invention. However, this is not necessarily the case. Instead, a conventional through-hole double-sided printed circuit board can be used as well. In addition, not only can the through hole substrate be used but also a ceramic substrate or the like.

EXAMPLES

This invention is further described below referring to Examples. In the following description, "%" means "weight %".

Figure 6:
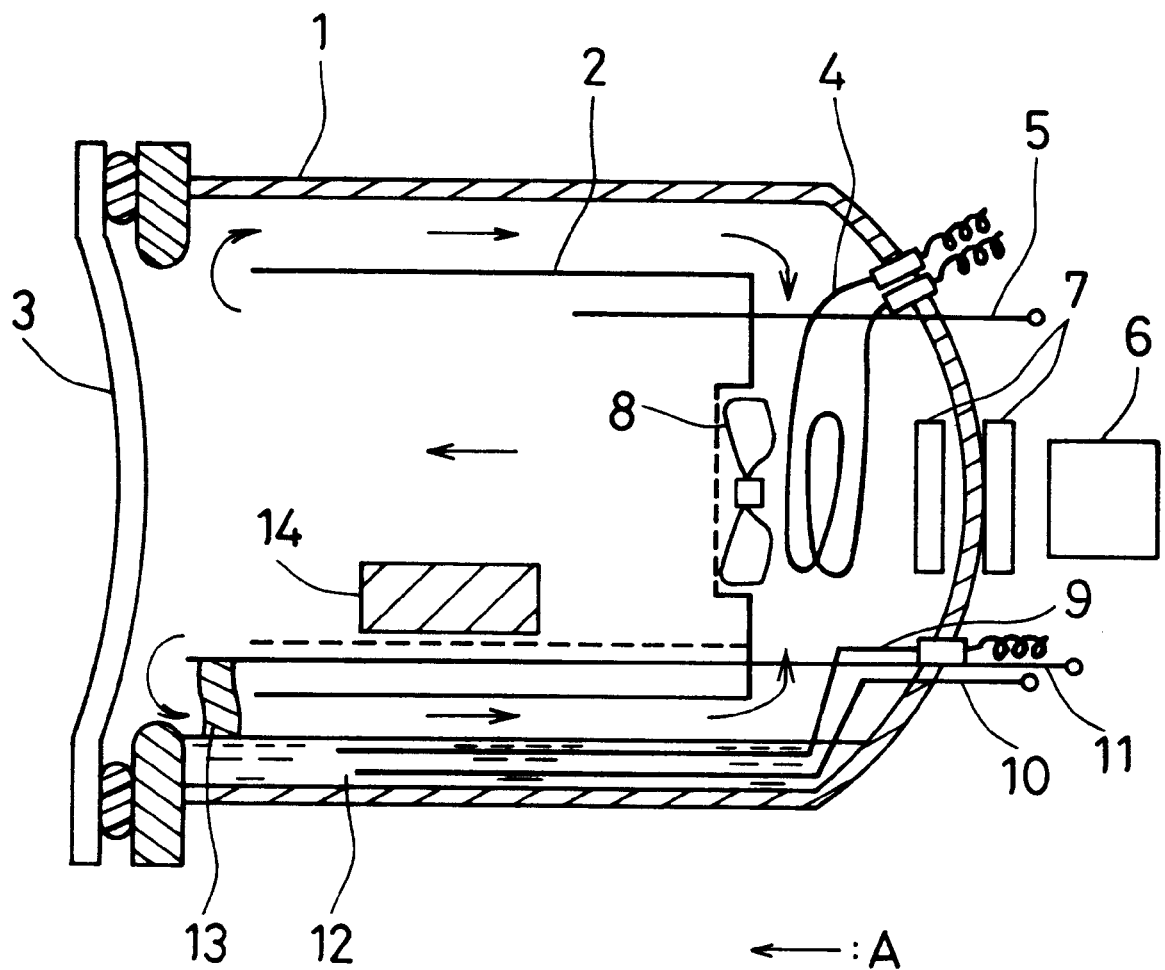
FIG. 6 is a schematic view of a measuring device for a pressure cooker test (PCT) in an embodiment of this invention.

The pressure cooker test (PCT) was carried out in the following manner. As shown in FIG. 6, humidifying water 12 in a pressure container 1 is heated with a humidifying heater 9 to maintain high pressure with steam inside the container. The steam is re-heated with a heater 4 and sent to the inner cylinder 2 by using a stirring fan 8. In FIG. 6, 3 denotes a door, and it is opened and closed for the sample 14 to enter and exit. Numeral 6 denotes a stirring motor, 7 denotes a magnetic coupling to transmit the torque of the stirring motor 6 to the stirring fan 8. Numeral 5 denotes an inner temperature sensor, 10 denotes a humidifying water temperature sensor, 11 denotes a wet-bulb temperature sensor, and 13 denotes a cloth wick (fibrous water absorptive core). The arrow A denotes to air stream. This measuring device is a commercial HAST Chamber, model EHS-411 supplied by TABAI ESPEC CORP. The sample was exposed to saturated steam at 2 atmospheric pressure at 121° C. by using the measuring device. The sample was then taken our from the PCT measuring device at established periods, wiped up with a lint-free wiper and left in an ordinary chamber with 23% relative humidity at 25° C. for two hours before the electrical resistivity was measured by a four-terminal method.

Example 1

In a first embodiment of this invention as shown in FIG. 1, a prepreg was an aramid epoxy sheet (TA-01 supplied by Teijin Ltd.) 200 $\mu$m in thickness. This prepreg was applied on one side with a 20 $\mu$m thick polyethylene terephthalate film by an adhesive and was provided with through-holes 0.2 mm in diameter by a drill.

These through holes were filled with via-hole filling conductive paste comprising compositions shown in Table 1. The compositions were previously mixed and kneaded in three roles. Table 1 shows the average size of the particle, the specific surface area, and the viscosity of the via-hole filling paste. The data was obtained by using an E-type viscometer at a shear rate of 1[l/sec.] at 25° C. The TI value measured by using the E-type viscometer indicates A/B, when (A) denotes viscosity at 25° C., 1[l/sec] while (B) denotes viscosity at 25° C., 2[l/sec].

TABLE 1

| Conductive particles | Particle diameter ($\mu$m) | Specific surface area (m$^2$/g) | Viscosity (Pa · s) | TI | Via resistivity ($\mu\Omega$ · cm) | Copper foil peeling strength (kgf/cm) |
|---|---|---|---|---|---|---|
| *Ag | 0.2 | 3.1 | >2000 | 1.79 | 41 | <0.5 |
| Ag | 2 | 0.27 | 250 | 0.89 | 8 | 1.8 |
| *Ag | 25 | 0.08 | 30 | 0.80 | 138 | 2.2 |
| Cu | 2 | 0.3 | 150 | 0.84 | 10 | 1.9 |
| Au | 3 | 0.15 | 110 | 0.75 | 9 | 1.5 |
| Ag—Pd alloy | 2 | 0.3 | 250 | 0.90 | 10 | 1.8 |
| Cu coated with Ag | 8 | 0.3 | 170 | 0.95 | 10 | 2.3 |

(1) Resin; bisphenol A type epoxy resin 40 phr + linoleic dimer acid type epoxy resin 40 phr + isoprene caproic acid dimer type epoxy resin 20 phr + amine hardener (MY-24 supplied by Ajinomoto Co., Ltd.) 15 phr
(2) Conductive particles/resin = 50/50 (volume ratio)
(3) TI; calculated from (A/B) wherein (A) is viscosity at 1 [1/sec] and (B) is viscosity at 2 [1/sec], 25° C.
(4) *: Comparative Examples The prepreg filled with the paste was provided with 35 $\mu$m-thick copper foils 102 on the upper and the lower sides. Then, this was formed into a double-sided copper applied plate by heating and pressurizing for 60 minutes at a temperature of 180° C. and 50 kg/cm$^2$. The double-sided copper applied plate formed in this manner was formed into electrode patterns by using a conventional etching technique.

Table 1 shows the connection resistivity of the inner-via-holes and the copper foil peeling strength for the respective conductive paste. In all cases, a low resistivity connection was obtained in which the volume resistivity of the via-holes was 100($\mu\Omega$·cm) or less when the conductive particles satisfied the requirements of this invention. For the copper foil peeling strength, the obtained value was as high as 1.5 kgf/cm or higher for any pastes when the conductive particles satisfied the requirements of this invention.

In a Comparative Examples where fine conductive particles were used, the paste had excessively high viscosity and high TI value, as well as low filling workability in filling the through-holes and a low copper foil peeling strength. In the second Comparative Example where large particles were used, the volume resistivity of the via-holes was as high as 130($\mu\Omega$·cm) or higher, though the filling workability and the copper foil peeling strength were high.

Example 2

In this Example, a conductive paste was prepared by kneading in three-roles 25–75 volume % copper powder whose average particle diameter was 2 $\mu$m and 75–25 volume % resin of Example 1. This paste was filled in a prepreg provided with through-holes 0.2 mm in diameter in the same manner as Example 1. After copper foils 102 were provided on the upper and lower sides of the prepreg filled with the paste, the prepreg was formed into a double-sided copper applied plate by heating and pressurizing for 60 minutes at 180° C. and 50 kg/cm². Electrode patterns were provided on the plate by using a conventional etching technique.

TABLE 2

| Conductive particles | | Viscosity | TI | Via resistivity | Copper foil peeling strength | Thermal shock test |
|---|---|---|---|---|---|---|
| vol. % | wt. % | (Pa · s) | | ($\mu\Omega$ · cm) | (kgf/cm) | (cycle) |
| *25 | 73 | 8 | 0.98 | 123 | — | <10 |
| 32 | 79 | 27 | 0.93 | 62 | 2.5 | 800 |
| 40 | 84 | 60 | 0.88 | 30 | 2.2 | >1000 |
| 50 | 89 | 150 | 0.84 | 10 | 1.9 | >1000 |
| 60 | 92.4 | 550 | 0.77 | 8 | 1.5 | >1000 |
| 68 | 94.5 | 1500 | 0.66 | 6 | 0.9 | >1000 |
| *75 | 96 | >2000 | — | 6 | <0.5 | 150 |

(1) Conductive particles; Cu Average diamater: 2 $\mu$m
(2) Resin; same as in Example 1
(3) TI; calculated form (A/B) wherein (A) is viscosity at 1 [1/sec] and (B) is viscosity at 2 [1/sec], at 25° C.
(4) *: Comparative Examples Table 2 shows the viscosity and TI value of each conductive paste for filling via-holes as well as the resistivity and the copper foil peeling strength of the inner-via-holes. In all cases, a low resistivity connection was obtained in which the volume resistivity was as low as 100($\mu\Omega$·cm) or lower when the conductive particles and resin satisfied the desired requirements. When the amount of the conductive particles is less than 30 volume % as in a Comparative Example, the conductive particles are insufficient and the via-hole resistivity was high. When the amount of the conductive particles exceeds 70 volume %, the paste viscosity and TI value became high and the filling of via-holes became difficult. For the copper foil peeling strength, the obtained value was as high as 1.5 kgf/cm or higher for any pastes when the amount of the conductive particles was not more than 70 volume %.

For an evaluation of reliability in thermal shock resistance of the inner-via-hole connection, a heat cycle test was carried out for the double-sided copper applied plates formed by filling the respective conductive pastes in via-holes at temperatures ranging from −55° C. to 125° C. for 30 minutes respectively. The result was evaluated based on the numbers of cycles in which the variation of the connection resistivity of the inner-via-hole was maintained within 10% of the initial value. Evaluations in reliability of thermal shock resistance in the following Examples were carried out in this manner. The result is shown in Table 2. The via-hole resistivity for each sample filled with the conductive paste of this invention was stable for at least several hundreds of heat cycles if the requirements of this invention were satisfied, and thus, the connection reliability of the via-holes was not decreased. When the amount of the conductive particles was less than 30 volume % as in a Comparative Example, the resistivity was increased radically in a short time, resulting in disconnection.

Example 3

In this Example, conductive pastes were prepared by kneading in three-roles 50 volume % copper powder as the conductive particles whose average particle diameter was 2 $\mu$m and 50 volume % resin described in Table 3. The surface oxygen concentration for the conductive particles was varied. The prepreg provided with through-holes 0.2 mm in diameter was filled with the paste and copper foils 102 were provided on the upper and the lower sides in the same manner as Example 1. Then, this was formed into a double-sided copper applied plate by heating and pressurizing for 60 minutes at 180° C. and 50 kg/cm². Electrode patterns were formed by using a conventional etching technique.

TABLE 3

| Surface Oxygen concentration (wt %) | Viscosity (Pa · s) | TI | Via resistivity ($\mu\Omega$ · cm) |
|---|---|---|---|
| 0.2 | 80 | 0.77 | 8 |
| 0.5 | 150 | 0.84 | 10 |
| *1.0 | 220 | 0.95 | 23 |
| 1.2 | 550 | 1.12 | 135 |

(1) Conductive particles; Cu Average diameter: 2 $\mu$m
(2) Resin; same as Example 1
(3) Conductive particles/resin = 50/50 (volume ratio)
(4) TI: calculated from (A/B) wherein (A) is viscosity at 1 [1/sec] and (B) is viscosity at 2 [1/sec], 25° C.
(5) *: Comparative Example Table 3 shows the viscosity and TI value of each conductive paste for filling via-holes as well as the connection resistivity of the inner-via-holes.

When a paste comprising copper powder whose surface oxygen concentration was not more than 1.0 weight %, connection with low resistivity was obtained in which resistivity was 100($\mu\Omega$·cm) or less. However, along with the increase in the surface oxygen concentration, the resistivity of the inner-via-hole connection became higher. As soon as this amount exceeded 1.0 weight %, the resistivity was increased radically. As a result, a low resistivity connection was not obtained in which the resistivity was 100($\mu\Omega$·cm) or less. In addition, the high paste viscosity and TI value hindered the workability in filling of the conductive paste.

Example 4

In this Example, resins claimed in this invention and those of Comparative Examples were compared. As shown in Table 4, the resins of this invention had epoxy compounds whose hydroxyl group, amino group and carboxyl group were decreased by a molecular distillation, while the resins of the Comparative Examples remained untreated. A conductive paste was prepared by kneading in three-roles 50 volume % copper powder as conductive particles whose average particle diameter was 2 $\mu$m and 50 volume % resins comprising hardeners described in Table 4, that is, glycidyl ether type epoxy resin, glycidyl ester type epoxy resin, glycidyl amine type epoxy resin, and alicyclic epoxy resin. The paste was filled in a prepreg provided with through holes of 0.2 mm in diameter as in Example 1.

TABLE 4

| Resins | H·X· % | | H·X· % |
|---|---|---|---|
| Glycidyl ether type epoxy resin | | | |
| a1; bisphenol F type epoxy resin [EPIKOTE 807 (by Yuka Shell Epoxy Co., Ltd.)] | 12 | a2; molecular distillation | 1 |
| Glycidyl ester type epoxy resin | | | |
| b1; phthalic acid type epoxy resin [EPIKOTE 190 (by Yuka Shell Epoxy Co., Ltd.)] | 20 | b2; molecular distillation | 9 |
| Glycidyl amine type epoxy resin | | | |
| c1; [ELM 100 (by SUMITOMO CHEMICAL CO., LTD.)] | 14 | c2; molecular distillation | 6 |
| Alicyclic epoxy resin | | | |
| d1; [ERL 4299 (by UCC)] | 38 | d2; molecular distillation | 9 |

(1) Conductive particles; Cu Average diameter: 2 $\mu$m
(2) Resin; above-noted resin 100 phr + amine hardener (MY-24) 15 phr
(3) Conductive particles/resin = 50/50 (volume ratio)
(4) X·H; (amount of hydroxyl group + amino group + carboxyl groups)/amount of epoxy group
H is calculated on the ratio of the maximum infrared absorbance of 3200–3600 cm$^{-1}$ to that of 880–940 cm$^{-1}$ "H" value in Table 4 denotes the proportion of the maximum absorbance of infrared absorption (3200–3600 cm$^{-1}$) caused by a hydroxyl group, an amino group and a carboxyl group to the maximum absorbance of infrared absorption caused by an epoxy group (880–940 cm$^{-1}$). First, H values of the compounds having known molecular structures were measured to find the relationship between the proportion of the total amount of the three kinds of groups to the epoxy group and the H values. When H was 10, the proportion was about 5%. The peaks of the infrared absorption caused by the three kinds of groups are in the range from 3200 to 3600 cm$^{-1}$, while the peak due to the epoxy groups is in the range from 880 to 940 cm$^{-1}$. Namely, when H exceeds 10, the proportion of the total amount of the three groups to the epoxy groups exceeds 5%.

Table 5 shows the viscosity and TI value of each conductive paste for filling via-holes. The conductive pastes (a2), (b2), (c2) and (d2) in Table 5 had epoxy compounds with decreased amount of a hydroxyl group, an amino group and a carboxyl group. Any of these pastes provided low viscosity, low TI value and high workability. In Table 5, (a1), (b1), (c1) and (d1) are conductive pastes in which the amount of the three functional groups is not decreased. For these pastes, the viscosity was excessively high, and the TI value was also high, and thus, the workability in filling via-holes was not high.

TABLE 5

| Resin | H* (%) | Viscosity (Pa · s) | TI | Via resistivity ($\mu\Omega$ · cM) | Copper foil peeling strength (kgf/cm) | Thermal shock test (cycle) |
|---|---|---|---|---|---|---|
| *a1 | 12 | >2000 | 1.41 | 115 | 1.4 | 450 |
| a2 | 1 | 650 | 0.96 | 10 | 2.2 | >1000 |
| *b1 | 20 | >2000 | 1.88 | 111 | 0.6 | 200 |
| b2 | 9 | 200 | 0.97 | 12 | 1.6 | >1000 |
| *c1 | 14 | >2000 | 2.02 | 120 | <0.5 | 180 |
| c2 | 6 | 140 | 0.99 | 12 | 1.5 | >1000 |
| *d1 | 38 | >2000 | 1.33 | 156 | <0.5 | 60 |
| d2 | 9 | 260 | 0.95 | 13 | 1.6 | >1000 |

(1) TI; calculated from (A/B) wherein (A) is viscosity at 1 [1/sec] and (B) is viscosity at 2 [1/sec], 25° C.
(2) *: Comparative Examples The prepreg filled with each paste was provided with copper foils 102 on the upper and the lower sides. Then, this was formed into a double-sided copper applied plate by heating and pressurizing for 60 minutes at 180° C. and 50 kg/cm$^2$. Electrode patterns were formed by using a conventional etching technique.

Table 5 shows the connection resistivity and copper foil peeling strength of the inner-via-holes for the pastes. In this table, (a2), (b2), (c2), and (d2) denote resins in which the three functional groups in the epoxy compound were decreased to the desired range. For these resins, the volume resistivity of the via-holes was as low as 100($\mu\Omega$·cm) or lower, and the copper foil peeling strength was as high as 1.5 kgf/cm or higher. The conductive pastes (a1), (b1), (c1), and (d1) in Table 5 comprise resins in which the functional groups of the epoxy resin were not decreased. For these conductive pastes, the resistivity was high while the strength was insufficient because such a paste was not filled sufficiently in the via-holes.

For an evaluation of the reliability in thermal shock resistance of the inner-via-hole connection, a heat cycle test was carried out for the double-sided copper applied plates formed by filling the respective conductive pastes in via-holes at temperatures ranging from –55° C. to 125° C. for 30 minutes respectively. The result was evaluated in the same manner as Example 2. The result is shown in Table 5. The via-hole resistivity for each sample filled with the conductive paste of this invention was stable for at least 1000 heat cycles if the conductive pastes (a2, b2, c2 and d2 in Table 5) satisfied the desired requirements, and thus, the connection reliability of the via-holes was not decreased. When the amount of a hydroxyl group, an amino group and a carboxyl group in the epoxy compounds deviated from the desired range, the resistivity was increased radically in a short time.

Example 5

In this Example, conductive pastes were prepared by kneading in three-roles 50 volume % copper powder as conductive particles whose average particle diameter was 2 $\mu$m and 50 volume % resins comprising hardeners shown in Table 6. The paste was filled in a prepreg proposed with through-holes 0.2 mm in diameter as in Example 1. Similar to Example 4, the resins of this invention had epoxy compound whose hydroxyl group, amino group and carboxyl group were decreased by a molecular distillation, while the resins of the Comparative Examples were not treated in the same manner. Comparison regarding the epoxy equivalent was also carried out, in which the resins of this invention had lower epoxy equivalent than those of the Comparative Examples.

TABLE 6

| | H (%) | | H (%) |
|---|---|---|---|
| a1; bisphenol F type epoxy resin [EPIKOTE 807 (by Yuka Shell Epoxy Co., Ltd.)] | 12 | a2; molecular distillation | 1 |
| e1; bisphenol A-type epoxy resin [EPIKOTE 828 (by Yuka Shell Epoxy Co., Ltd.)] | 11 | e2; molecular distillation | 6 |
| f1; bisphenol AD-type epoxy resin [EPOMIK R 710 (by Mitsui Chemicals, Inc.)] | 7 | f2; molecular distillation | 3 |
| g1; a1 + e1 [9:1] | 12 | g2; molecular distillation | 2 |
| h1; naphthalene-type epoxy resin + a1 [1:1] [HP4032 (by Dainippon Ink And Chemicals, Inc.)] | 13 | h2; molecular distillation | 4 |
| i; linoleic dimer acid type epoxy resin [EPOTOHTO YD171 (by TOHTO KASEI)] | 22 | | |
| j; ethylene oxide denatured bisphenol A type epoxy resin (Formula 6) | 23 | | |

(1) Conductive particles; Cu Average diameter: 2 μm
(2) Resin; above-identified resin 100 phr + amine hardener (MY-24) 15 phr
(3) Conductive particles/resin = 50/50 (volume ratio)

The prepreg filled with this paste was provided with copper foil 102 on the upper and the lower sides. Then, this was formed into a double-sided copper applied plate by heating and pressurizing for 60 minutes at 180° C. and 50 kg/cm². Electrode patterns were formed by using a conventional etching technique.

Table 7 shows the viscosity and TI value of each conductive paste for filling via-holes, and water absorption of hardened pastes. For measuring the water absorption, each conductive paste was filled in a disc mold 20 mm in diameter and 1 mm in thickness, and pressurized with heat for 60 minutes at a pressure of 50 kg/cm² at 180° C. The weight increasing rate of the hardened paste in a PCT (121° C., 2 atmospheric pressure, for 50 hours) was used for evaluating the water absorption. Table 7 shows the connection resistivity at inner-via-holes and copper foil peeling strength for each paste. In the following Examples, the water absorption of the hardened pastes was evaluated in the same manner.

viscosity and low TI value, and high workability. For the water absorption of hardened conductive pastes at a PCT, a conductive paste comprising an epoxy compound in the desired range had a low water absorption of not more than 10 weight %. Furthermore, the pastes of this invention achieved electrical connection with low volume resistivity of 100($\mu\Omega$·cm) or less, and the copper foil peeling strength was as high as 1.5 kgf/cm or higher.

Conductive pastes comprising resins with higher amounts of the above-mentioned three groups had excessively high viscosity and high TI value excepting "i" in Table 7. These pastes were low in workability in filling the via-holes, and the volume resistivity of the via-holes was high. Conductive pastes ("i" and "j" in Table 7) comprising resins of high epoxy equivalent had an excessively high water absorption and low copper foil peeling strength.

For evaluating the reliability in moisture resistance of the inner-via-hole connection, PCT was carried out on the double-sided copper applied plates that had been produced by filling the conductive pastes in the via-holes. The result was evaluated based on the cycle number that the variation of the connection resistivity of the inner-via-hole was maintained within 10% of the initial value. The result is shown in Table 7. The samples of the Comparative Example ("e1", "i", and "j" in Table 7) resulted in disconnection in 100 hours, while the pastes of this invention showed high connection reliability in moisture resistance.

For an evaluation of reliability in thermal shock resistance of the inner-via-hole connection, the heat cycle test was carried out for the double-sided copper applied plates formed by filling the respective conductive pastes in via-holes at temperatures ranging from –55° C. to 125° C. for 30 minutes respectively. The result was evaluated in the same manner as Example 2. The result is shown in Table 7. The via-hole resistivity for each sample filled with the conductive paste of this invention was stable for at least 1000 heat cycles if the conductive pastes satisfied the claimed requirements, and thus, the connection reliability of the via-holes was not decreased. When the amount of the hydroxyl group, amino group and carboxyl group in the epoxy compounds deviated from the desired range ("a1", "e1", "g1" and "h1" in Table 7), the resistivity was increased radically in a short time.

TABLE 7

| Resin | Viscosity (Pa·s) | TI | Water absorption (%) | Via resistivity (μΩ·cm) | Copper foil peeling strength (kgf/cm) | PCT (Hr) | Thermal shock test (cycle) |
|---|---|---|---|---|---|---|---|
| (1) | 150 | 0.84 | 3 | 10 | 1.7 | >100 | >1000 |
| (2) | 180 | 0.92 | 4 | 11 | 1.6 | >100 | >1000 |
| (3) | 65 | 0.65 | 3 | 10 | 2.1 | >100 | >1000 |
| (4) | 40 | 0.90 | 5 | 11 | 2.0 | >100 | >1000 |
| (5) | 160 | 0.83 | 3 | 10 | 1.7 | >100 | >1000 |
| (6) | 85 | 0.66 | 4 | 10 | 2.0 | >100 | >1000 |
| (7) | 140 | 0.77 | 3 | 10 | 1.7 | >100 | >1000 |
| (8) | 60 | 0.62 | 4 | 10 | 2.2 | >100 | >1000 |
| (9) | 350 | 0.91 | 4 | 10 | 2.7 | >100 | >1000 |
| *(10) | 1200 | 1.10 | 3 | 10 | 1.3 | >100 | 800 |
| *(11) | 80 | 0.81 | 30 | 10 | >0.5 | 15 | >1000 |

(1) TI; calculated from (A/B) wherein (A) is viscosity at 1 [1/sec] and (B) is viscosity at 2 [1/sec], 25° C.
(2) *: Comparative Examples When the hydroxyl group, amino group and carboxyl group in the epoxy compound for the resin was decreased to the desired level and the epoxy equivalent was also controlled to the desired level, the conductive paste had low

Example 6

In this Example, a conductive paste was prepared by kneading in three-roles 50 volume % copper powder as conductive particles whose average particle diameter was 2 μm and 50 volume % bisphenol F type epoxy resin comprising hardeners shown in Table 8. The epoxy equivalent of the resin was varied as shown in Table 8. Similar to Example 1, the prepreg provided with through-holes 0.2 mm in diameter was filled with the paste and copper foils 102 were provided on the upper and the lower sides. Then, this was formed into a double-sided copper applied plate by heating and pressurizing 60 for minutes at 180° C. and 50 kg/cm². Electrode patterns were formed by using a conventional etching technique.

TABLE 8

| Epoxy equivalent | H* (%) | Viscosity (Pa · s) | TI | Water absorption (wt %) | Via resistivity (μΩ · cm) | Copper foil peeling strength (kgf/cm) |
| --- | --- | --- | --- | --- | --- | --- |
| 164 | 2 | 650 | 0.96 | 4 | 10 | 2.2 |
| 236 | 9 | 1900 | 0.99 | 5 | 12 | 1.9 |
| *363 | 15 | >2000 | 1.12 | 11 | 170 | 0.7 |

(1) Conductive particles; Cu Average diameter: 2 μm

TABLE 8-continued

| Epoxy equivalent | H* (%) | Viscosity (Pa · s) | TI | Water absorption (wt %) | Via resistivity (μΩ · cm) | Copper foil peeling strength (kgf/cm) |
| --- | --- | --- | --- | --- | --- | --- |

(2) Resin; bisphenol F type epoxy resin 100 phr + amine hardener (MY-24) 15 phr
(3) Conductive particles/resin = 50/50 (volume ratio)
(4) TI; calculated from (A/B) wherein (A) is viscosity at 1 [1/sec] and (B) is viscosity at 2 [1/sec], 25° C.
(5) *: Comparative Example Table 8 shows the viscosity, TI value of each conductive paste for filling via-holes, water absorption of hardened pastes as well as the connection resistivity and copper foil peeling strength of the inner-via-hole-connection. As the epoxy equivalent was increased, the paste viscosity and TI value were increased, and the conductive paste was difficult to fill and it had high water absorption. High epoxy equivalent is considered to increase the resin's viscosity, inevitably increase the hydroxyl groups in the epoxy compound, and lower the hardening crosslink density. Conductive pastes with epoxy equivalent in the desired range had low viscosity, low TI value and provided high workability in filling. Furthermore, the conductive paste had low water absorption, and thus, the volume resistivity was as low as 100(μΩ·cm) or lower. For the copper foil peeling strength, the obtained value was as high as 1.5 kgf/cm or higher for any pastes.

Example 7

In this Example, conductive pastes were prepared by kneading in three-roles 50 volume % copper powder as conductive particles whose average particle diameter was 2 μm, and 50 volume % composition as a mixture of group A resin (bisphenol type epoxy resin), group B resin and an amine hardener as shown in Table 9. Similar to Example 1, the prepreg provided with holes 0.2 mm in diameter was filled with the pastes. The numeral (9) in table 9 partially comprises a resin other than the epoxy compound, or polyvinyl butyral (PVB).

TABLE 9

| | Group A resins | Group B sesins |
| --- | --- | --- |
| (1) | Bisphenol F type epoxy resin | Linoleic dimer acid type epoxy resin Table 6(i) |
| (2) | Table 6 (a2) | (k)# |
| (3) | | Table 6(i) + (k) [2:1] |
| (4) | | Table 6(i) + (i)# [4:1] |
| (5) | Bisphenol AD type epoxy resin | Linoleic dimer acid type epoxy resin Table 6(i) |
| (6) | Table 6 (e2) | Table 6(i) + (k) [2:1] |
| (7) | Bisphenol F type epoxy resin + | Linoleic dimer acid type epoxy resin Table 6(i) |
| (8) | Bisphenol A type epoxy resin | Table 6(i) + (k) [2:1] |
| (9) | Table 6 (g2) | (k) + (m)# + (n)# [10:4:1] |
| (10) | Bisphenol F type epoxy resin Table 6 (a1) | Linoleic dimer acid type resin Table 6(i) |
| (11) | None | Linoleic dimer acid type epoxy resin Table 6(i) |

(1) Conductive particles; Cu Average diameter: 2 μm
(2) Resin; Group A resin/Group B resin/hardener (MY-24) = 40/60/15 (weight ratio)
(3) Conductive particles/resin = 50/50 (volume ratio)
(4) # (k) isoprene caproic acid dimer glycidyl ester (Formula 8)
(l) lauryl glycidyl ether (Formula 10)
(m) versatic acid glycidyl ester (Formula 9)
(n) polyvinyl butyral Table 10 shows the viscosity, TI value of the conductive pastes for filling via-holes, and water absorption of hardened pastes. In Table 10, (1)–(9) denote conductive pastes in which a hydroxyl group, an amino group and a carboxyl group included in the epoxy compound were decreased to the desired level and the epoxy equivalent was also controlled to be within the desired range. These pastes had low viscosity, low TI value and high workability. In addition, the water absorption in PCT regarding the hardened pastes was as low as 10% or lower. Numerals (10) and (11) denote conductive pastes comprising resins in which the total amount of the above-identified three groups exceeded the claimed range. The resin (10) had high viscosity, high TI value, and the workability in filling in prepreg through-holes was low. The resin (11) had low viscosity, however, the water absorption was excessively high since the epoxy equivalent exceeded the claimed rang.

TABLE 10

| Resin | Viscosity (Pa · s) | TI | Water absorption (%) | Via resistivity ($\mu\Omega \cdot cm$) | Copper foil peeling strength (kgf/cm) | PCT (Hr) | Thermal shock test (cycle) |
|---|---|---|---|---|---|---|---|
| (1) | 150 | 0.84 | 3 | 10 | 1.7 | >100 | >1000 |
| (2) | 180 | 0.92 | 4 | 11 | 1.6 | >100 | >1000 |
| (3) | 65 | 0.65 | 3 | 10 | 2.1 | >100 | >1000 |
| (4) | 40 | 0.90 | 5 | 11 | 2.0 | >100 | >1000 |
| (5) | 160 | 0.83 | 3 | 10 | 1.7 | >100 | >1000 |
| (6) | 85 | 0.66 | 4 | 10 | 2.0 | >100 | >1000 |
| (7) | 140 | 0.77 | 3 | 10 | 1.7 | >100 | >1000 |
| (8) | 60 | 0.62 | 4 | 10 | 2.2 | >100 | >1000 |
| (9) | 350 | 0.91 | 4 | 10 | 2.7 | >100 | >1000 |
| *(10) | 1200 | 1.10 | 3 | 10 | 1.3 | >100 | 800 |
| *(11) | 80 | 0.81 | 30 | 10 | >0.15 | >1000 | 5 |

(1) TI; calculated from (A/B) wherein (A) is viscosity at 1[1/sec] and (B) is viscosity at 2[1/sec], 25° C.
(2)*: Comparative Examples The prepreg filled with the paste was provided with copper foils 102 on the upper and the lower sides. Then, this was formed into a double-sided copper applied plate by heating and pressurizing for 60 minutes at a temperature of 180° C. and 50 kg/cm$^2$. The double-sided copper applied plate formed in this manner was formed into electrode patterns by using a conventional etching technique.

Table 10 shows the connection resistivity and copper foil peeling strength of the inner-via-holes for each paste. In the conductive pastes (1)–(9), a hydroxyl group, an amino group and a carboxyl group included in the epoxy compound were decreased to the desired level and the epoxy equivalent was controlled to be within the claimed range. In all cases, the volume resistivity for connection was as low as 100($\mu\Omega$·cm) or lower, and the copper foil peeling strength was as high as 1.5 kgf/cm or higher. Even in a resin other than epoxy resin, i.e., the conductive paste (9) comprising PVB, the resistivity in connection was low and the copper foil peeling strength was as high as 2.5 kgf/cm or higher. Regarding the conductive pastes of Comparative Examples in which the amount of the above-identified three groups deviated from the range, the resistivity was slightly high and the copper foil peeling strength was low in (10), since the workability in filling in the prepreg through-holes was low. In (11), the copper foil peeling strength was considerably low since the epoxy equivalent exceeded the desired range, though the resistivity was low.

For evaluating the reliability in moisture resistance of the inner-via-hole connection, PCT was carried out for the double-sided copper applied plates that had been produced by filling the conductive pastes in the via-holes. The result was evaluated in the same manner as Example 5. The result is shown in Table 10. The sample (11) of the Comparative Example resulted in disconnection in a short period, while the pastes of this invention showed high connection reliability in moisture resistance.

For an evaluation of the reliability in thermal shock resistance of the inner-via-hole connection, the heat cycle test was carried out for the double-sided copper applied plates formed by filling the respective conductive pastes in via-holes at temperatures ranging from –55° C. to 125° C. for 30 minutes respectively. The result was evaluated in the same manner as Example 2. The result is shown in Table 10. The via-hole resistivity for each sample filled with the conductive paste of this invention was stable for at least 1000 heat cycles if the conductive pastes satisfied the claimed requirements, and thus, the connection reliability of the via-holes was not decreased.

Example 8

In Example 8, influences of resin composition of group A resin (bisphenol type epoxy resin: (g2)) and group B resin (linoleic dimer acid glycidyl ester type epoxy resin: (i)) were examined. A conductive paste was prepared by kneading in three-roles 50 volume % copper powder as conductive particles whose average diameter was 2 $\mu$m and 50 volume % composition as a mixture of resins of groups A and B and an amine hardener. Similar to Example 1, the paste was filled in a prepreg provided with through-holes 0.2 mm in diameter.

TABLE 11

| Resin | Resin A Table 6 g2 (%) | Resin B Table 6 i (%) | Viscosity (Pa · s) | TI | Water Absorption (%) | Via resistance ($\mu\Omega \cdot cm$) | Copper foil peeling strength (kgf/cm) | PCT (Hr) |
|---|---|---|---|---|---|---|---|---|
| *(11) | 0 | 100 | 80 | 0.81 | 30 | 10 | <0.5 | 15 |
| *(12) | 20 | 80 | 110 | 0.80 | 23 | 10 | 0.7 | 20 |
| (7) | 40 | 60 | 140 | 0.77 | 4 | 10 | 1.7 | >100 |
| (13) | 60 | 40 | 200 | 0.80 | 3 | 10 | 2.0 | >100 |
| (14) | 80 | 20 | 370 | 0.85 | 2 | 10 | 2.2 | >100 |
| (15) | 100 | 0 | 550 | 0.89 | 2 | 10 | 2.3 | >100 |

(1) Conductive particles: Cu Average diameter: 2 $\mu$m
(2) Resin; above-noted resin 100 phr + amine hardener (MY-24) 15 phr
(3) Conductive particles/resin = 50/50 (volume ratio)
(4) TI; calculated from (A/B) wherein (A) is viscosity at 1 [1/sec] and (B) is viscosity at 2 [1/sec], 25° C.
(5) *: Comparative Examples Table 11 shows the viscosity and TI value of conductive pastes for filling via-holes, and water absorption of hardened pastes. The conductive pastes shown as (7), (13)–(15) in Table 11 comprised at least 40% resins of group A. The resins of group A included epoxy compounds in which the hydroxyl group, amino group and carboxyl group were decreased to the claimed level and the epoxy equivalent also was controlled to the desired range. Any of these pastes had low viscosity and high workability, while the water absorption at a PCT for the hardened pastes was as low as 10% or lower. In Table 11, (11) and (12) denote conductive pastes comprising epoxy compounds in which the above-identified three groups deviated from the desired range and the epoxy equivalent was higher than the desired level. Though these pastes had low viscosity and low TI value, the water absorption of the hardened pastes was excessively high.

The prepreg filled with the pastes was provided with copper foils 102 on the upper and the lower sides. Then, this was formed into a double-sided copper applied plate by heating and pressurizing for 60 minutes at a temperature of 180° C. and 50 kg/cm$^2$. The double-sided copper applied plate formed in this manner was formed into electrode patterns by using a conventional etching technique.

Table 11 shows the connection resistivity and copper foil peeling strength of the inner-via-hole for the respective pastes. In all cases, a low resistivity connection was obtained in which the volume resistivity was 100 ($\mu\Omega\cdot$cm) or less. For the copper foil peeling strength, the obtained value was as high as 1.5 kgf/cm or higher for all pastes ((7), (13)–(15) in Table 11) since the conductive pastes included at least 40% group A resins as mentioned above. A conductive paste comprising not more than 20% the group A resin had low strength in copper foil peeling though the viscosity was low and the workability in filling in prepreg through-holes was high.

For evaluating the reliability in moisture resistance of the inner-via-hole connection, a PCT was carried out regarding the double-sided copper applied plates that had been produced by filling the conductive pastes in the via-holes. The result was evaluated in the same manner as Example 5. The result is shown in Table 11. The samples (11) and (12) of the Comparative Example resulted in disconnection in a short period, while the pastes of this invention showed high connection reliability in moisture resistance.

Example 9

In this Example, conductive pastes were prepared by kneading in three-roles 50 volume % copper powder as conductive particles whose average particle diameter was 2 $\mu$m and 50 volume % composition as a mixture of resins in group A (bisphenol type epoxy resin), group B, group C (oligomer) and amine hardeners. The groups A–C are shown in Table 12. The paste was filled in a prepreg provided with through-holes 0.2 mm in diameter as in Example 1.

TABLE 12

| | Group A (resin) | Group B resin | Group C resin | A % | B % | C % |
|---|---|---|---|---|---|---|
| i | Bisphenol AD type | (k) + (m) [9:2] | (P) | 40 | 55 | 5 |
| ii | Table 6 (e2) | (k) + (m) [3:1] | (Q) | 40 | 40 | 20 |
| iii | Bisphenol F type + | (k) + (m) [9:2] | (P) | 40 | 55 | 5 |
| iv | Bisphenol A type | (k) + (m) [9:2] | (R) | 40 | 55 | 5 |
| v | Table 6 (g2) | (k) + (m) [4:1] | (P) | 40 | 25 | 35 |

(1) Conductive particles; Cu Average diameter: 2 $\mu$m
(2) Resin; above-noted resin 100 phr + amine hardener (MY-24) 1 5phr
(3) Conductive particles/resin = 50/50 (volume ratio)
(4) (k) Isopren caproic acid dimer glycidyl ester (Formula 8)
(m) Versatic acid glycidyl ester (Formula 9)
(P) EPOLEAD PB4700 (Dicel Chemistry, epoxy equivalent: 166)
(Q) EPOLEAD D200 (Dicel Chemistry, epoxy equivalent: 220)
(R) EPOLEAD D204 (Dicel Chemistry, epoxy equivalent: 400)

Table 13 shows the viscosity and TI value of conductive pastes for filling via-holes, and water absorption of hardened pastes. The conductive pastes (i),(ii), (iii) and (iv) in Table 13 comprised group C resins (epoxy oligomer) within the desired range not to exceed 30%. All of these pastes had low viscosity, low TI value and high workability in filling. The water absorption at a PCT for each hardened paste was as low as 10% or lower. In Table 13, (v) denotes a conductive paste in which the group C resin exceeds the claimed range of 30%. While the water absorption was low, the paste had excessively high viscosity and high TI value, and the workability in filling prepreg through-holes was low.

TABLE 13

| Resin | Viscosity (Pa · s) | TI | Water absorption (%) | Via resistivity ($\mu\Omega$ · cm) | Copper foil peeling strength (kgf/cm) | PCT (Hr) | Thermal shock test (cycle) |
|---|---|---|---|---|---|---|---|
| i | 280 | 0.90 | 4 | 10 | 2.5 | >100 | >1000 |
| ii | 380 | 0.91 | 3 | 11 | 2.3 | >100 | >1000 |
| iii | 250 | 0.89 | 4 | 10 | 2.5 | >100 | >1000 |
| iv | 340 | 0.91 | 4 | 10 | 2.3 | >100 | >1000 |
| *v | >2000 | 1.11 | 4 | 32 | 0.7 | >100 | 300 |

(1) TI; calculated from (A/B) wherein (A) is viscosity at 1 [l/sec] and (B) is viscosity at 2 [l/sec], 25° C.
(2) *: Comparative Examples The prepreg filled with the paste was provided with copper foil 102 on the upper and the lower sides. Then, this was formed into a double-sided copper applied plate by heating and pressurizing for 60 minutes at a temperature of 180° C. and 50 kg/cm$^2$. The double-sided copper applied plate formed in this manner was formed into electrode patterns by using a conventional etching technique.

Table 13 shows the connection resistivity and copper foil peeling strength of the inner-via-holes for the respective pastes. In all cases, low resistivity connection was obtained in which the volume resistivity was 100($\mu\Omega\cdot$cm) or less if the amount of the epoxy oligomer of the group C was within the desired range of 30%. For the copper foil peeling strength, the obtained value was as high as 2 kgf/cm or higher for all pastes. A conductive paste comprising more than 30% group C resin had low workability in filling prepreg through-holes, and thus, the resistivity was slightly high and the copper foil peeling strength was low.

For an evaluation of reliability in thermal shock resistance of the inner-via-hole connection, the heat cycle test was carried out for the double-sided copper applied plates formed by filling the respective conductive pastes in via-holes at temperatures ranging from −55° C. to 125° C. for 30 minutes respectively. The result was evaluated in the same manner as Example 2. The result is shown in Table 13. The via-hole resistivity for each sample filled with the conductive paste of this invention was stable for at least 1000 heat cycles if the conductive pastes satisfied the desired requirements, and thus, the connection reliability of the via-holes was not decreased.

Example 10

A conductive paste was prepared by kneading in three-roles 50 volume % copper powder as conductive particles whose average diameter was 2 μm and 50 volume % mixture of a resin (8) in Table 9 and a hardener. An aramid-epoxy prepreg comprised a prepreg provided with through-holes 0.2 mm in diameter were filled with the above-mentioned paste. This aramid-epoxy prepreg was positioned between two sheets of aramid-epoxy double-sided substrates having patterns formed for the connection resistivity measurement. Then, this was formed into a four-layer printed circuit board by heating and pressurizing for 60 minutes at 180° C. and 50 kg/cm².

The inner-via-hole connection resistivity formed between the second and the third layer of the four-layer substrate showed the same resistivity of (8) in Example 7. Also, a six-layer printed circuit board attained the same reliability with the same connection resistivity as in the four-layer printed circuit board.

Furthermore, the above-mentioned paste was used for producing an aramid-epoxy double-sided substrate with the same method as in Example 1. One sheet of this substrate was positioned between two sheets of aramid-epoxy prepregs comprising prepregs having through-holes 0.2 mm in diameter filled with the above-noted paste. In the method of forming a four-layer printed circuit board by heating and pressurizing for 60 minutes at 180° C. and 50 kg/cm², equivalent resistivity was obtained for the via-hole-connection. In addition, the same reliability was obtained in a six-layer printed circuit board produced by using this method.

A ceramic substrate with circuits was used instead of the aramic-epoxy double-sided substrate manufactured by the same method as in Example 1, and the same reliability was obtained for the via-hole-connection resistivity.

As described above, according to a double-sided printed circuit board, a multilayer printed circuit board, and methods of producing the same with use of the via-hole filling paste of this invention, a double-sided printed circuit board with inner via holes can be attained without using a through-hole plating technique. Furthermore, this circuit board can be formed into a multilayer printed circuit board easily.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A conductive paste for filling via-holes, comprising:
   (a) 30–70 volume % of conductive particles having an average diameter from 0.5 to 20 μm and a specific surface area from 0.05 to 1.5 m²/g;
   (b) 70–30 volume % of resin containing at least 10 weight % of epoxy compound having at least one epoxy group per molecule, wherein, in the epoxy compound the total amount of a hydroxyl group, an amino group and a carboxyl group is not more than 5 mol % of the epoxy group, and an epoxy equivalent of the epoxy compound ranges from 100 to 350 g/eq.

2. The conductive paste according to claim 1, wherein the conductive particles are at least one kind of particle selected from the groups I–IV:
   (I) at least one kind of particle selected from the group consisting of gold, platinum, silver, palladium, copper, nickel, tin, lead, and indium;
   (II) alloy particles of arbitrarily-combined materials selected from the group consisting of gold, platinum, silver, palladium, copper, nickel, tin, lead, indium, zinc and chromium;
   (III) particles having cores of either conductive or non-conductive particles coated with at least one metal selected from the group consisting of gold, platinum, silver, palladium, copper, nickel, tin, lead, and indium;
   (IV) particles having cores of either conductive or non-conductive particles coated with alloy of arbitrarily-combined materials selected from the group consisting of gold, platinum, silver, palladium, copper, nickel, tin, lead, indium, zinc and chromium.

3. The conductive paste according to claim 1, wherein the conductive particles comprise copper whose surface oxygen concentration is 1.0 weight percent or less.

4. The conductive paste according to claim 1, wherein the epoxy compound is at least one epoxy resin selected from the group consisting of glycidyl ether type epoxy resin, glycidyl ester type epoxy resin, glycidyl amine type epoxy resin, and alicyclic epoxy resin.

5. The conductive paste according to claim 1, wherein the epoxy compound is a bisphenol glycidyl ether type epoxy resin.

6. The conductive paste according to claim 1, wherein the epoxy compound comprises an epoxy oligomer whose weight-average molecular weight ranges from 600 to 10000.

7. The conductive paste according to claim 1, wherein the epoxy compound comprises:
   (A) 90–20 weight % of bisphenol glycidyl ether type epoxy resin; and
   (B) 10–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms.

8. The conductive paste according to claim 1, wherein the epoxy compound comprises:
   (A) 90–19 weight % of bisphenol glycidyl ether type epoxy resin;
   (B) 9–80 weight % of at least one epoxy resin selected from the group consisting of long-chain aliphatic alcohol glycidyl ether type epoxy resin having at least eight carbon atoms or long-chain fatty acid glycidyl ester type epoxy resin having at least eight carbon atoms; and (C) 1–30 weight % of epoxy oligomer whose weight-average molecular weight ranges from 600 to 10000.

9. The conductive paste according to claim 1, wherein the viscosity of the paste composition is represented by (A/B)=1 or less, where (A) denotes viscosity at 1[1/sec] while (B) denotes viscosity at 2[1/sec], at 25° C.

10. A double-sided printed circuit board comprising an insulating base material provided with inner-via-holes filled with a conductive resin, and upper and lower electrode layers on the insulating base that are electrically connected to each other, wherein the conductive resin comprises (a) 30–70 volume % of conductive particles having an average diameter from 0.5 to 20 μm and a specific surface area from 0.05 to 1.5 m$^2$/g, and (b) 70–30 volume % of resin containing at least 10 weight % of epoxy compound having at least one epoxy group per molecule, and in the epoxy compound, the total amount of a hydroxyl group, an amino group and a carboxyl group is not more than 5 mol % of the epoxy group, and the epoxy equivalent of the epoxy compound ranges from 100 to 350 g/eq, wherein the conductive resin composition is hardened in the inner-via-holes.

11. The double-sided printed circuit board according to claim 10, wherein the insulating base comprises a composite material of an aramid fiber and a thermosetting resin.

12. The double-sided printed circuit board according to claim 10, wherein the insulating base comprises a composite material of an aramid nonwoven fabric in which a thermosetting resin is impregnated.

13. A multilayer printed circuit board comprising a plurality of insulating base layers and two or more electrode layers, each insulating base being provided with inner-via-holes filled with a conductive resin, wherein the conductive resin comprises at least 30–70 volume % of conductive particles having an average diameter from 0.5 to 20 μm and a specific surface area from 0.05 to 1.5 m$^2$/g; and 70–30 volume % of resin containing at least 10 weight % of epoxy compound having at least one epoxy group per molecule, and in the epoxy compound the total amount of a hydroxyl group, an amino group and a carboxyl group is not more than 5 mol % of the epoxy group, wherein an epoxy equivalent of the epoxy compound ranges from 100 to 350 g/eq, wherein the resin is hardened in the inner-via-holes, wherein the electrode layers are connected to each other via the inner-via-holes.

14. The multilayer printed circuit board according to claim 13, wherein the insulating base comprises a composite material of an aramid fiber and a thermosetting resin.

15. The multilayer printed circuit board according to claim 13, wherein the insulating base comprises a composite material of an aramid nonwoven fabric in which a thermosetting resin is impregnated.

16. A method for producing a double-sided printed circuit board comprising the steps of:

providing a prepreg for a printed circuit board with via-holes;

filling the via-holes with a conductive paste comprising (a) 30–70 volume % of conductive particles having an average diameter from 0.5 to 20 μm and a specific surface area from 0.05 to 1.5 m$^2$/g; and (b) 70–30 volume % of resin containing at least 10 weight % of epoxy compound having at least one epoxy group per molecule, wherein in the epoxy compound, the total amount of a hydroxyl group, an amino group and a carboxyl group is not more than 5 mol % of the epoxy group, and an epoxy equivalent of the epoxy compound ranges from 100 to 350 g/eq;

placing copper foils on the upper and lower surfaces of the prepreg, heat-pressurizing the prepreg with the copper foils;

and forming an electric circuit by etching the copper foils.

17. The method for producing a double-sided printed circuit board according to claim 16, wherein the prepreg comprises a composite material of an aramid fiber and a thermosetting resin.

18. The method for producing a double-sided printed circuit board according to claim 16, wherein the prepreg is a sheet composed of an aramid nonwoven fabric impregnated with a thermosetting epoxy resin.

19. The method for producing a double-sided printed circuit board according to claim 16, wherein the conductive particles are at least one kind of particles selected from the groups I–IV:

(I) at least one kind of particle selected from the group consisting of gold, platinum, silver, palladium, copper, nickel, tin, lead, and indium;

(II) alloy particles of arbitrarily-combined materials selected from the group consisting of gold, platinum, silver, palladium, copper, nickel, tin, lead, indium, zinc and chromium;

(III) particles having cores of either conductive or non-conductive particles coated with at least one metal selected from the group consisting of gold, platinum, silver, palladium, copper, nickel, tin, lead, and indium; and (IV) particles having cores of either conductive or non-conductive particles coated with alloy of arbitrarily-combined materials selected from the group consisting of gold, platinum, silver, palladium, copper, nickel, tin, lead, indium, zinc and chromium.

20. The method for producing a double-sided printed circuit board according to claim 16, wherein the conductive particles comprise copper whose surface oxygen concentration is 1.0 weight percent or less.

21. The method for producing a double-sided printed circuit board according to claim 16, wherein the epoxy compound is at least one epoxy resin selected from the group consisting of glycidyl ether type epoxy resin, glycidyl ester type epoxy resin, glycidyl amine type epoxy resin, and alicyclic epoxy resin.

22. The method for producing a double-sided printed circuit board according to claim 16, wherein the epoxy compound is a bisphenol glycidyl ether type epoxy resin.

23. The method for producing a double-sided printed circuit board according to claim 16, wherein the epoxy compound comprises an epoxy oligomer whose weight-average molecular weight ranges from 600 to 10000.

24. The method for producing a double-sided printed circuit board according to claim 16, wherein the epoxy compound comprises:

(A) 90–20 weight % of bisphenol glycidyl ether type epoxy resin; and (B) 10–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms.

25. The method for producing a double-sided printed circuit board according to claim 16, wherein the epoxy compound comprises:

(A) 90–19 weight % of bisphenol glycidyl ether type epoxy resin;

(B) 9–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms; and (C) 1–30 weight % of epoxy oligomer whose weight-average molecular weight ranges from 600 to 10000.

26. The method for producing a double-sided printed circuit board according to claim 16, wherein the viscosity of the paste composition is represented by (A/B)=1 or less, where (A) denotes viscosity at 1[1/sec] while (B) denotes viscosity at 2[1/sec].

27. A method for producing a multilayer printed circuit board comprising the steps of:
   providing a prepreg for a printed circuit board with via-holes;
   filling the via-holes with a conductive paste comprising (a) 30–70 volume % of conductive particles having an average diameter from 0.5 to 20 $\mu$m and a specific surface area from 0.05 to 1.5 $m^2$/g; and (b) 70–30 volume % of resin containing at least 10 weight % of epoxy compound having at least one epoxy group per molecule, wherein in the epoxy compound, the total amount of a hydroxyl group, an amino group and a carboxyl group is not more than 5 mol % of the epoxy group, and an epoxy equivalent of the epoxy compound ranges from 100 to 350 g/eq in order to form a substrate intermediate; and
   forming a multilayer printed circuit board including the substrate intermediate, by a process selected from Process (A) and Process (B):
   Process (A):
      disposing a pair of substrate intermediates to vertically sandwich a double-sided printed circuit board and disposing copper foils to vertically sandwich the substrate intermediates;
      heat-pressurizing the substrate intermediates and the double-sided printed circuit board with the copper foils; and
      forming electric circuits by etching the copper foils;
   Process (B):
      disposing double-sided printed circuit boards to vertically sandwich the substrate intermediate; and
      heat-pressurizing the substrate intermediate with the double-sided printed circuit boards.

28. The method for producing a multilayer printed circuit board according to claim 27, wherein the prepreg comprises a composite material of an aramid fiber and a thermosetting resin.

29. The method for producing a multilayer printed circuit board according to claim 27, wherein the prepreg is a sheet composed of an aramid nonwoven fabric impregnated with a thermosetting epoxy resin.

30. The method for producing a multilayer printed circuit board according to claim 27, wherein the conductive particles are at least one kind of particles selected from the groups I–IV:
   (I) at least one kind of particle selected from the group consisting of gold, platinum, silver, palladium, copper, nickel, tin, lead, and indium;
   (II) alloy particles of arbitrarily-combined materials selected from the group consisting of gold, platinum, silver, palladium, copper, nickel, tin, lead, indium, zinc and chromium;
   (III) particles having cores of either conductive or non-conductive particles coated with at least one metal selected from the group consisting of gold, platinum, silver, palladium, copper, nickel, tin, lead, and indium;
   (IV) particles having cores of either conductive or non-conductive particles coated with alloy of arbitrarily-combined materials selected from the group consisting of gold, platinum, silver, palladium, copper, nickel, tin, lead, indium, zinc and chromium.

31. The method for producing a multilayer printed circuit board according to claim 27, wherein the conductive particles comprise copper whose surface oxygen concentration is 1.0 weight percent or less.

32. The method for producing a multilayer printed circuit board according to claim 27, wherein the epoxy compound is at least one epoxy resin selected from the group consisting of glycidyl ether type epoxy resin, glycidyl ester type epoxy resin, glycidyl amine type epoxy resin, and alicyclic epoxy resin.

33. The method for producing a multilayer printed circuit board according to claim 27, wherein the epoxy compound is a bisphenol glycidyl ether type epoxy resin.

34. The method for producing a multilayer printed circuit board according to claim 27, wherein the epoxy compound comprises an epoxy oligomer whose weight-average molecular weight ranges from 600 to 10000.

35. The method for producing a multilayer printed circuit board according to claim 27, wherein the epoxy compound comprises:
   (A) 90–20 weight % of bisphenol glycidyl ether type epoxy resin; and
   (B) 10–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms.

36. The method for producing a multilayer printed circuit board according to claim 27, wherein the epoxy compound comprises at least:
   (A) 90–19 weight % of bisphenol glycidyl ether type epoxy resin;
   (B) 9–80 weight % of at least one epoxy resin selected from the group consisting of long-chain aliphatic alcohol glycidyl ether type epoxy resin having at least eight carbon atoms and long-chain fatty acid glycidyl ester type epoxy resin having at least eight carbon atoms; and
   (C) 1–30 weight % of epoxy oligomer whose weight-average molecular weight ranges from 600 to 10000.

37. The method for producing a multilayer printed circuit board according to claim 27, wherein the viscosity of the paste composition is represented by (A/B)=1 or less, where (A) denotes viscosity at 1[1/sec] while (B) denotes viscosity at 2[1/sec].

* * * * *